United States Patent [19]

Kewitsch et al.

[11] Patent Number: 5,422,873
[45] Date of Patent: Jun. 6, 1995

[54] MULTIPLEXING AND SELECTIVE UPDATABLE FIXING AND ERASING OF VOLUME HOLOGRAMS IN PHOTOREFRACTIVE MEDIA AND SECOND HARMONIC GENERATION IN PHOTOREFRACTIVE MEDIA BY OPTICALLY INDUCED PERIODIC POLING

[75] Inventors: Anthony S. Kewitsch; Mordechai Segev, both of Pasadena; Amnon Yariv, San Marino, all of Calif.

[73] Assignee: California Institute of Technology, Pasadena, Calif.

[21] Appl. No.: 37,076

[22] Filed: Mar. 25, 1993

[51] Int. Cl.[6] .............................................. G11B 7/00
[52] U.S. Cl. ........................... 369/103; 369/288; 359/2; 359/10; 365/125; 365/216
[58] Field of Search ............... 359/1, 7, 4, 10, 22, 359/2; 369/103, 288; 365/125, 216

[56] References Cited

U.S. PATENT DOCUMENTS

| | | | |
|---|---|---|---|
| 3,567,305 | 3/1971 | Collier et al. | |
| 3,627,400 | 12/1971 | Caulfield | 359/25 |
| 3,652,145 | 3/1972 | Thaxter | 359/7 |
| 3,847,465 | 12/1974 | Micheron et al. | 365/117 |
| 3,940,201 | 2/1976 | Micheron et al. | 365/125 |
| 4,076,370 | 2/1978 | Wako | 359/25 |
| 4,120,569 | 10/1978 | Richards, Jr. | 359/11 |
| 4,138,189 | 2/1979 | Huignard et al. | 359/7 |
| 4,429,954 | 2/1984 | Caulfield et al. | 359/7 |
| 4,505,536 | 3/1985 | Huignard et al. | 359/7 |
| 4,636,027 | 1/1987 | Dube | 365/125 |
| 4,655,542 | 4/1987 | Dube | 359/7 |
| 4,927,220 | 5/1990 | Hesselink et al. | 359/7 |
| 4,988,153 | 1/1991 | Paek | 369/103 |
| 5,007,690 | 4/1991 | Chern et al. | 369/103 |
| 5,111,445 | 5/1992 | Psaltis et al. | 359/25 |
| 5,272,550 | 12/1993 | Dickson et al. | 369/103 |

OTHER PUBLICATIONS

Optics Communications, vol. 29, No. 1, Apr. 1979, pp. 44-47, "Light Diffraction From The Volume Holograms In Electrooptic Birefringent Crystals" by M. P. Patrov et al.

Applied Optics, vol. 29, No. 8, Mar. 10, 1990, pp. 1059-1061, "Use Of Photorefractive Fiber In Optical Interconnections And Switching" by Shudong Wu et al.

Applied Physics Letters, vol. 56, No. 2, Jan. 8, 1990, pp. 108-110, "Quasi-Phase-Matched Second-Harmonic Generation Of Blue Light In Periodically poled LiNbO$_3$" by G. A. Magel et al.

(List continued on next page.)

Primary Examiner—Paul M. Dzierzynski
Assistant Examiner—Kim-Kwok Chu
Attorney, Agent, or Firm—Blakely, Sokoloff, Taylor & Zafman

[57] ABSTRACT

New methods are presented for multiplexing volume holograms in electrooptic materials. Multiple volume holograms can be superimposed in a medium and be individually addressed by tuning the underlying refractive index of the medium or the crystal parameters, while keeping the external parameters (wavelength, angles) fixed. According to the presented methods, the refractive index and crystal parameters of the material can be varied via the electrooptic, elastooptic or piezoelectric effects, alone or in combination with each other, by tuning the value of an applied electric field, or by tuning an applied mechanical stress, or by changing the material temperature. Volume holograms that have been multiplexed by either wavelength or angle or electric field or mechanical stress or temperature can be individually addressed by any one of the same five parameters. Additionally, selective, updatable fixing and erasing of volume holograms in photorefractive media is described. Each holographic page may be fixed individually and overwritten without destroying the other fixed pages. Further, Second Harmonic Generation and Parametric Amplification by optically induced periodic poling in ferroelectric photorefractive materials is described.

21 Claims, 13 Drawing Sheets

OTHER PUBLICATIONS

Applied Physics Letters, vol. 59, No. 21, Nov. 18, 1991, pp. 2657–2659, "Periodically Poled LiNbO$_3$ For High-Efficiency Second-Harmonic Generation" by D. H. Jundt et al.

IEEE Journal Of Quantum Electronics, vol. 28, No. 11, Nov. 1992, pp. 2631–2654, "Quasi-Phase-Matched Second Harmonic Generation Tuning And Tolerances" by Martin M. Fejer et al.

Applied Physics Letters, vol. 20, No. 2, Jan. 15, 1972, pp. 79–81, "Electrical Control Of Fixation And Erasure Of Holographic Patterns In Ferroelectric Materials" by F. Micheron et al.

Soviet Physics-Crystallography, vol. 14, No. 6, May–Jun., 1970, pp. 894–896, "Effect Of Illumination On Polarization Reversal In The Ferroelectric Semiconductor SbSI Using The Barkhausen Effect" by A. A. Bogomolov et al.

Applied Physics Letters, vol. 18, No. 12, Jun. 15, 1971, pp. 540–542, "Holographic Pattern Fixing In Electro-Optic Crystals" by Juan J. Amodei et al.

Applied Physics Letters, vol. 28, No. 4, Feb. 15, 1976, pp. 224–226, "Mobile Si Ions In Fe-Doped LiNbO$_3$ Crystals" by B. F. Williams et al.

Applied Physics Letters, vol. 49, No. 18, Nov. 3, 1986, pp. 1140–1142, "Hologram Fixing Process At Room Temperature In Photorefractive Bi$_{12}$SiO$_{20}$ Crystals" by J. P. Herriau et al.

Applied Physics Letters, vol. 26, No. 1, Jan. 1, 1975, pp. 22–24, "High-Sensitivity Optical Recording In KTN By Two-Photon Absorption" by D. Von Der Linde et al.

"Kinetics Of Fixation Of Phase Holograms In LiNbO$_3$" by W. Meyer et al.

Optical Engineering, vol. 17, No. 4, Jul.–Aug., 1978, pp. 308–316, "Volume Phase Holographic Storage In Ferroelectric Crystals" by W. J. Burke et al.

Ferroelectrics, vol. 3, 1972, pp. 107–113, "Thermally Fixed Holograms In LiNbO$_3$" by D. L. Staebler et al.

Applied Physics Letter, vol. 26, No. 4, Feb. 15, 1975, pp. 182–184, "Multiple Storage And Erasure Of Fixed Holograms In Fe-Doped LiNbO$_3$" by D. L. Staebler et al.

Ferroelectrics, vol. 8, 1974, pp. 441–442, "PhotoInduced Phase Transitions In (Sr,Ba) Nb$_2$O$_6$ Crystals And Applications" by F. Micheron et al.

Applied Optics, vol. 28, No. 11, Jun. 1, 1989, pp. 1967–1969, "Hologram Fixing In Bi$_{12}$TiO$_{20}$ Using Heating And An AC Electric Field" by S. W. McCahon et al.

Optics Letters, vol. 16, No. 8, Apr. 15, 1991, pp. 554–556, "Fixing Of A Photorefractive Grating In KTa$_{1-x}$Nb$_x$O$_3$ By Cooling Through The Ferroelectric Phase Transition" by Victor Leyva et al.

Applied Physics Letters, vol. 60, No. 26, Jun. 29, 1992, pp. 3212–3214, "Determination Of H. Concentration In LiNbO$_3$ By Photorefractive Fixing" by R. Muller et al.

Applied Optics, vol. 13, No. 4, Apr., 1974, pp. 788–794, "Fe-Doped LiNbO$_3$ For Read-Write Applications" by D. L. Staebler et al.

Soviet Physics-Doklady, vol. 10, No. 7, Jan., 1966, pp. 639–640, "Stepwise Polarization Reversal In Ferroelectric Crystals Caused By External Mechanical Stress" by L. A. Shuvalov et al.

Soviet Physics-Solid State, vol. 9, No. 11, May, 1968, pp. 2624–2625, "Polarization Discontinuities In Ferroelectric SbSI Caused By Illumination" by V. M. Rudyak et al.

"Spontaneous Polarization Reversal And Photorefractive Effect in Single-Domain Iron-Doped Lithium Niobate Crystals" by V. I. Kovalevich et al.

Applied Physics Letters, vol. 50, No. 3, Mar., 1979, pp. 1222–1225, "Tunable Multilayer Film Distributed-Gragg-Reflector Filter" by Mitsuteru Kimura et al.

Journal of the Optical Society of America, vol. 9, No. 7, Jul. 1992, pp. 1183–1192, "Multiplex Holography In Strontium Barium Niobate With Applied Field" by J. E. Ford et al.

Applied Optics, vol. 27, No. 8, Apr. 15, 1988, pp. 1603–1606, "Enhanced Optooptical Light Deflection Using Cavity Resonance" by William H. Steier et al.

Technical Digest Series, vol. 17, Aug. 12–14, 1987, pp. 155–158, "Fast Hologram Erasure In photorefractive Materials" by Gregory Kavounas et al.

Optics Letters, vol. 17, No. 20, Oct. 15, 1992, pp. 1471–1473, "Optical Data Storage By Using Orthogonal Wavelength-Multiplexed Volume Holograms" by George A. Rakuljic et al.

(List continued on next page.)

OTHER PUBLICATIONS

Applied Optics, vol. 2, No. 4, Apr., 1963, pp. 393–400, "Theory Of Optical Information Storage In Solids" by P. J. Van Heerden.

Applied Optics, vol. 13, No. 4, Apr., 1974, pp. 913–924, "Unique Properties of SBN And Their Use In A Layered Optical Memory" by J. B. Thaxter et al.

Optics & Photonics News, Aug., 1992, pp. 16–25, "Volume Hologram Optical Memories" by Richard G. Zech.

IEEE Photonics Technology Letters, vol. 4, No. 10, Oct., 1992, pp. 1115–1118, "Diffraction Characteristics Of Superimposed Holographic Gratings In Planar Optical Waveguides" by V. Minier et al.

Applied optics, vol. 13, No. 4, Apr., 1974, pp. 784–787, "Electrical Control In Photoferroelectric Materials For Optical Storage" by F. Micheron et al.

Optics Letters, vol. 17, No. 12, Jun. 15, 1992, pp. 853–855, "Electric-Field-Controlled Diffraction In Photorefractive Strontium Barium Niobate" by Jeffrey P. Wilde et al.

Applied Physics Letters, vol. 62, No. 5, Feb. 1, 1993, pp. 435–436, "First-Order Quasi-Phase Matched LiNbO$_3$ Waveguide Periodically Poled By Applying An External Field For Efficient Field For Efficient Blue Second-Harmonic Generation" by M. Yamada et al.

MULTIPLEXING AND SELECTIVE UPDATABLE FIXING AND ERASING OF VOLUME HOLOGRAMS IN PHOTOREFRACTIVE MEDIA AND SECOND HARMONIC GENERATION IN PHOTOREFRACTIVE MEDIA BY OPTICALLY INDUCED PERIODIC POLING

ORIGIN OF THE INVENTION

The U.S. Government has certain rights in this invention pursuant to United States Army contract No. DAAL03-89-K-0153.

BACKGROUND OF THE INVENTION

1. Field of the Invention

The present invention relates to holographic optical processing apparatus and methods, and particularly to those apparatus and methods relating to multiplexing and fixing and erasing volume holograms in photorefractive media and optical second harmonic generation in photorefractive media by optically induced periodic poling.

2. Description of the Prior Art

An optical hologram is a record of the interference pattern produced when two wavefronts of light overlap. These wavefronts must be mutually coherent so that the interference pattern is stationary in space during the recording process. Mutual coherence merely means that there is a fixed phase relationship between the spatially overlapping parts of the two wavefronts.

In the normal practice of recording a hologram, the two wavefronts are derived from a single sufficiently coherent light source by means of a beam splitting device. One of these two beams is the reference beam, and the other beam carries the information, and is otherwise known as the signal beam. The reference beam, once superimposed with the signal wavefront, acts as a phase reference standard. The two wavefronts interfere, and the interference shows up as a pattern of light and dark. The recorded interference patterns each constitute an ensemble of diffraction gratings that are capable of constructively diffracting properly directed illuminating light to reconstruct an image of the recorded subject. This interference pattern can be recorded by placing a piece of photosensitive material in the original space where the two wavefronts overlap and interfere. This process is known as recording a hologram, which therefore means storing a phase or amplitude pattern which includes the information.

During the reconstruction (or data retrieval) process, only the reference beam is present, and it passes through the developed hologram as it did during the recording period. The beam is now phase and/or amplitude modulated by the holographic pattern previously recorded there. The hologram impresses on the wavefront the same interference pattern which existed during recording of the hologram. When this pattern has been impressed, the reference wavefront produces a set of waves with the proper phase delays, which add constructively in phase to form a replica of the signal beam used during recording. The signal beam is therefore said to have been reconstructed.

As a technique, optical holography shows great promise for a number of possible applications, most notably as a memory function; information could be stored by being recorded in a hologram, and retrieved by reading out the hologram.

For such possible applications, it is usually desirable to multiplex many holograms in the same medium. This would mean recording several superimposed holograms within the medium (which is also known as multiplexing them). In such applications, each such hologram is known in the art as a picture or a page. There are two difficulties in this endeavor. The first one is the limited capacity of holographic materials, and the second is with individually addressing each hologram without interference from the other coexisting holograms when reading it out (also known as demultiplexing).

A dramatic advantage in both directions is offered by shifting from thin photographic materials to thick holographic materials, which allow volume holograms to be recorded in them. Bulk photorefractive crystals store volume holograms as modulations of the underlying refractive index of the material.

Thick photosensitive materials are capable of storing far more data than thin materials. (P. J. Van Heerden, Applied Optics vol. 2, no. 4, April 1963, pp. 393–400.) Another advantage of volume holograms over those in photographic media is that there is no developing of the medium required. Sometimes thermal or electrical fixing is a recommended process, but not necessary. Furthermore, thick materials are reusable, being erasable electrically (F. Micheron, C. Mayeux, and J. C. Trotier, Applied Optics vol. 13, no. 4, April 1974, pp. 784–787), optically (G. T. Kavounas and W. H. Steier, Topical Meeting On Photorefractive Materials, Effects, and Devices, Technical Digest Series Volume 17, August 12–14, 1987, Los Angeles, Calif.) or thermally (J. J. Amodei, D. L. Staebler, Appl. Phys. Lett. 18, 540–545, 1971), without necessarily changing the apparatus.

A crystal is ferroelectric if a spontaneous polarization can be induced in it by applying an electric field, and additionally if this spontaneous polarization can be reversed by applying the same electric field in the opposite direction. A subgroup of non-centrosymmetric crystals exhibit photorefractivity, an effect that is commonly used to store volume phase holograms. Two coherent, monochromatic laser beams interfering in a photorefractive crystal will induce an electronic space charge field with the same periodicity as the optical interference pattern, through the photorefractive effect. This electronic space charge field may be of the order of 1 kV/cm. Bulk photorefractive crystals have been used for applications such as data storage, defect enhancement, optical correlation and convolution, optical interconnects, associative memories, etc. (Hesselink et al., U.S. Pat. No. 4,927,220) These applications have used mostly commercially available bulk crystals such as the piezoelectrics $LiNbO_3$ (Lithium niobate), SBN (Strontium Barium niobate), KLTN (Potassium Lithium Tantalum Niobate) and the paraelectric BSO (Bismuth Silicon oxide) (J. B. Thaxter and M. Kestigian, Applied Optics vol. 13, no. 4, April 1974, pp. 913–924). Volume holograms have also been written in materials containing living cells, algae, and organic crystals such as nonlinear polymers, e.g. NPDA (Bisphenol-A-diglycidylether 4-Nitro-1,2-phenylenediamine).

SBN is a medium of particular interest. It has a composition $Sr_xBa_{1-x}Nb_2O_6$, with x typically having values in the range of 0.25 and 0.75. As x tends to 0.75, the electrooptic coefficient increases in magnitude, accordingly increasing the available electrooptic effect and hologram diffraction efficiency.

It is also well known that the hologram capacity or minimum diffraction efficiency increases when an electric field is applied to the photorefractive medium. Specifically, Thaxter in U.S. Pat. No. 3,652,145 has shown that the read out diffraction efficiency of a photorefractive hologram stored in a single SBN crystal depends strongly on a uniform electric field applied along the z axis.

Multiplexing Holograms

The problem of recording and then individually addressing each recorded hologram is presently tackled in a number of ways.

a) Holograms overlapping within the material

This method corresponds to the storage of an ensemble of holographic pages, each page distributed over and sharing the volume of the material.

1) Pure angle multiplexing and demultiplexing

A common method to individually address a single page out of an ensemble is by angularly multiplexing the holograms in the medium, which means that each hologram is recorded at a different angle of incidence of the writing beams. (J. E. Ford, J. Ma, Y. Fainman, and S. H. Lee, Y. Taketomi, d. Bize and R. R. Neurgaonkar, J. Opt. Soc. Am. Vol. 9, no. 7, July 1992, pp. 1183–1192) Each hologram can be individually addressed by having the reference beam impinge at the angle of incidence that the hologram was written at. The disadvantage of this method is that it requires either a moving mirror or acoustooptic or electrooptic beam deflectors to change the angles of incidence. In general it suffers from relatively large crosstalk relative to wavelength multiplexing.

2) Pure wavelength multiplexing and demultiplexing

Another way of multiplexing volume holograms in a single medium is by recording the holograms at different wavelengths. (G. A. Rakuljic, V. Leyva and A. Yariv, Optics Letters vol. 17, no. 20, Oct. 15, 1992, pp. 1471–1473) The advantage of this method is that a single, multi-chromatic source, such as a dye laser, may be used to record and then read out different holograms without changing the angles of incidence. A disadvantage is that the diffraction efficiency of each hologram varies with the wavelength. Another disadvantage is that tunable laser sources with light power exceeding 100 mW are complex, costly devices.

3) Hybrid multiplexing and demultiplexing

Additionally, there are hybrid approaches. Holograms that have been recorded by wavelength multiplexing can be read out by angle demultiplexing, and conversely, holograms that have been recorded by angle multiplexing can be read out by wavelength demultiplexing. A general problem with hybrid approaches is that they result in spatial distortion of the reconstructed signal beam.

Naturally, with hybrid multiplexing, the reconstructed signal beam will contain the phase information of the recording signal beam, but will not be necessarily of the same wavelength.

b) Holograms not overlapping within the material

Another approach is by space division multiplexing of the holograms. The holographic recording medium is considered divided into many pixels and one hologram is recorded in each pixel. Complex apparatus is required to steer the reading beam to the requisite pixel, which usually involves either a moving mirror or acoustooptic or electrooptic beam deflectors.

Fixing Holograms

When volume holograms have first been written in a photorefractive material, they are called "dynamic" electronic holograms, dynamic in the sense that they inevitaby decay when being read out by a reference beam. In other words, the diffraction efficiency of the hologram is reduced with readout time. The time constant of such decay is relatively close (i.e. within an order of magnitude) to the time constant of writing the hologram, if the readout reference beam is of the same wavelength, intensity and angle as the writing beams. This problem may be avoided by reconstruction with a readout beam substantially weaker than the writing beam. One technique for extending the readout life of dynamic holograms is to read and write with different polarizations, called enhanced non destructive readout.

Another way of dealing with this decay problem is by a process of "fixing" the holograms. The term has its origin from the equivalent art of fixing photographic materials.

A convenient way of defining a "fixed" hologram would be a hologram that has a decay time constant that is substantially larger than its recording time. The ratio is typically many orders of magnitude, but it can be as low as one order of magnitude. The decay time constant in this instance would be that of the decaying hologram, as it is being read out with a light beam of the same wavelength, intensity and angle as was used in recording it. This would not necessarily be a practical way to read out a hologram (because writing intensities are generally much larger than readout intensities), but is a good way of defining the term "fixed hologram".

Permanent fixing of volume holograms in photorefractive media was first demonstrated in $LiNbO_3$ using a thermal fixing process (Amodei, J. J. and Staebler, D. L.: 'Holographic Pattern Fixing in Electro-optic Crystals', Appl. Phys. Lett.; 1971, 18, pp. 540–542). A hologram would be fixed when the time constant of its decay (caused by readout) is much larger (many orders of magnitude) than the time constant involved in writing it. The physical mechanism responsible for the fixed grating is believed to be either ionic compensation of the space charge grating during a thermal development cycle (Matull, R. and Rupp, R. A.: 'Microphotometric investigation of fixed holograms', J Phys. D: Appl. Phys., 1988, 21, pp. 1556–1565), or space charge induced local ferroelectric domain reversal (Kovalevich, V. I., Shuvalov, L. A., and Volk, T. R.; 'Spontaneous Polarization Reversal and Photorefractive Effect in Single-Domain Iron-Doped Lithium Niobate Crystals', Phys. Stat. Sol. (a), 1978, 45, pp. 249–252).

Permanent fixing was soon thereafter reported in SBN:75, using an electrical fixing pulse to bias the hologram about the coercive field (Micheron F. and Bismuth, G.: 'Field and time threshold for the electrical fixation of holograms recorded in $Sr_{0.75}Ba_{0.25}Nb_2O_6$ crystals', Appl. Phys. Lett., 1973, 23, pp. 71–72), or photoinduced ferroelectric domain nucleation upon cooling from the paraelectric phase (Micheron F. and Trotier, G. C.: 'Photoinduced Phase Transitions in $(Sr,Ba)Nb_2O_6$ Crystals and Applications', Ferroelectrics, 1974, 8, pp. 441–442). The electrical fixing technique was also applied to $BaTiO_3$ (Micheron F. and Bismuth, G.: 'Electrical Control of Fixation and Erasure of Holographic Patterns in Ferroelectric Materials', Appl. Phys. Lett. 1972, 20, pp. 79–81).

In addition, fixing has been reported in BTO (McCahon, S. W., Rytz, D., Valley, G. C., Klein, M. B., and Wechsler, B. A.: 'Hologram fixing in $Bi_{12}TiO_{20}$ using heating and an ac electric field', Appl. Opt., 1967, 28, pp. 1967–1969), BSO (Herriau, J. P. and Huignard, J. P.: 'Hologram fixing process at room temperature in photorefractive $Bi_{12}SiO_{20}$ crystals', Appl Phys Lett, 1986, 49, pp. 1140–1142), and KTN (Leyva, V. Agranat, A. and Yariv, A.: 'Fixing of a photorefractive grating in $KTa_{1-x}Nb_xO_3$ by cooling through the ferroelectric phase transition', Opt Lett., 1991, 16, pp. 554–556).

A common characteristic of all these fixing techniques is a single process step of development in which all the previously recorded space charge holograms are simultaneously fixed. This would involve, for example, heating a $LiNbO_3$ memory to 130° C., or applying an electrical pulse. After the development process step, the holographic memory is unable to be selectively updated. To update a single page of holographic data, the entire memory (i.e. all pages) must be erased and then rewritten. This would involve, for example, heating a $LiNbO_3$ memory to 200° C., or $\gamma$-irradiating it. For applications such as a random access memory, the ability to selectively update existing fixed holograms is highly desirable.

Selective Erasure of Portions of a Hologram

It would be very desirable to update only portions of a permanently recorded hologram. The prior art has not achieved this yet.

Second Harmonic Generation and Parametric Amplification

Second Harmonic Generation (SHG) and Parametric Amplification are well known in the art, and described in many text books. They usually depend on the crystal being naturally anisotropic, or specially grown to have some periodicity of ferroelectric domain built in. Alternately, angle phase matching is required for SHG to occur.

A compact blue or green coherent light source is essential for high-density optical data storage, laser printing, and display applications. Laser-diode-based second-harmonic generation (SHG) devices are potentially useful for compact blue or green coherent light sources. The conversion efficiency of quasi-phase matched (QPM) SHG is highest when periodic reversal of the sign of the nonlinear coefficient d of the material occurs in the phase matching period. [J. A. Armstrong, N. Bloembergen, J. Ducuing, and P. S. Pershan, Phys. Rev. 127, 1981 (1962). S. Somekh and A. Yariv, Opt. Commun. 6, 301 (1979).] $LiNbO_3$ can realize efficient SHG devices on account of its large nonlinear optical coefficient $d_{33}$. A variety of methods of domain inversion of $LiNbO_3$ have been reported [E. Lim, M. M. Fejer, and R. L. Byer, Electron. Lett. 25, 174 (1989). J. Webjorn, F. Laurell, and G. Arvidson, IEEE Photon. Technol. Lett. 1, 316 (1989).], but these methods cannot be used to fabricate a sufficiently fine and deep periodically inverted domain structure.

A fine and deep domain in $LiNbO_3$ has been fabricated by applying an external field. [M. Yamada, N. Nada, and K. Watanabe, Integ. Photon. Res. Tech. Dig. 10, TuC 2 (1992)] A periodically inverted domain structure in a $LiNbO_3$ substrate by applying an external electric field, which yields an efficient first-order QPM-SHG device has also been fabricated. [M. Yamada, N. Nada, M. Saitoh, and K. Watanabe, Appl. Phys. Lett. 62, 435 (1993)]. The problem is that the modulation depth of the grating will decrease with distance from the surface on which the special electrod has been applied. Further, the alternating period seems limited by the electrode spacing. For manufacturing purposes it seems limited to a few microns.

It has been reported in the literature that the domain inversion of $LiNbO_3$ is difficult at room temperature. [H. D. Megaw, Acta Cryst. 7, 187 (1954).] $LiNbO_3$ is usually broken without domain inversion when an external field is applied at room temperature. The external field for domain inversion of $LiNbO_3$ is close to that of the electron avalanche, so the $LiNbO_3$ substrate is broken without its spontaneous polarization being inverted with the application of an external field.

Quasi-phase-matched (QPM) [J. A. Armstrong, N. Bloembergen, J. Ducuing, and P. S. Pershan, Phys. Rev. 127, 1981 (1962).], efficient second-harmonic generation (SHG) using periodic reversals in the sign of the nonlinear coefficient to compensate for dispersion has recently been demonstrated in bulk [D. H. Jundt, G. A. Magel, M. M. Fejer, and R. L. Byer, in *Digest of Conference on Lasers and Electro-Optics* (Optical Society of America, Washington, D.C., 1991), p. 614, postdeadline paper CPDP22.] as well as in waveguide devices. [K. Yamamoto, K. Mizuuchi, and T. Taniuchi, *Digest of Conference on Lasers and Electro-Optics* (Optical Society of America, Washington, D.C., 1991), p. 616, postdeadline paper CPDP23. C. J. van der Poel, J. D. Bierlein, J. B. Brown, and S. Colak, Appl. Phys. Lett. 57, 2074 (1990).] QPM allows interactions between waves polarized such that the nonlinearity is maximized and allows interactions in materials for which birefrigent phase matching is not possible, e.g., SHG of blue light in $LiNbO_3$. First-order QPM requires sign reversals of the effective nonlinear coefficient with a period equal to two coherence lengths. Alternating ferroelectric domains have been a achieved in $LiNbO_3$, $LiTaO_3$, and $KTiOPO_4$ (KTP) by modulating the dopant concentration during growth [Nai-Ben Ming, Jing-Fen Hong, and Duan Feng, J. Mater. Sci. 17, 1663, (1982)], indiffusing dopants [C. J. van der Poel, J. D. Bierlein, J. B. Brown, and S. Colak, Appl. Phys. Lett. 57, 2074 (1990); E. J. Lim, M. M. Fejer, and R. L. Byer, Electron. Lett. 25 174 (1989).], applying electric fields [A. Feisst and P. Koidl, Appl. Phys. Lett. 47, 1125 (1985); S. Matsumoto, E. J. Lim, M. M. Fejer, and H. M. Hertz, *Digest of Integrated Photonics Research Topical Meeting* (Optical Society of America, Washington, D.C., 1991), p. 79, paper ThC4] or by techniques using electron beams [H. Ito, C. Takyu, and H. Inaba, Electron. Lett. 27, 1221 (1991)] or $SiO_2$ masks [J. Webjörn, F. Laurell, and G. Arvidsson, IEEE Photon. Technol. Lett. 1, 316 (1989); M. Fujimura, T. Suhara, and H. Nishihara, Electron. Lett. 27, 1207 (1991)].

In $LiNbO_3$ QPM allows nonlinear interactions between waves polarized along the z axis, for which the largest nonlinear coefficient $d_{eff}=2d_{33}/\pi=20.9$ pm/V can be used. [Landolt-Börnstein, in *Zahlenwerte und Funktionen aus Naturwissenschaften und Technik, Neue Serie*, edited by K. -H. Hellwege and A. M. Hellwege (Springer, Berlin, 1975); R. C. Eckhardt, H. Masuda, Y. X. Fan, and R. L. Byer, IEEE J. Quantm Electron. 26, 922 (1990).] In practice, the creation of the required, finely spaced domains with sufficiently accurate periodicity is a challenging task. [M. M. Fejer, G. A. Magel, D. H. Jundt, and R. L. Byer (unpublished).] Feng, et al. produced Czochralski-grown $LiNbO_3$ crystals doped with 0.5–1 wt. % Yttrium with domain lengths of 3.4 $\mu$m to frequency double the 1.064 $\mu$m Nd:YAG laser line. [D. Feng, N. B. Ming, J. F. Hong, Y. S. Yang, J. S. Zhu, Z. Yang, and Y. N. Wang, Appl. Phys. Lett. 37, 607 (1980); Y. H. Xue, N. B. Ming, J. S. Zhu, and D. Feng, Chin. Phys. 4, 554 (1984).] The observed conversion efficiency increased quadratically with the crystal length as expected for perfect domain periodicity up to lengths of about 680 μm, corresponding to 200 domains. For longer crystals the increase was linear, revealing domain-boundary position errors on the order of the coherence length. These positions errors are probably caused by variations in growth speed due to thermal fluctuations during the Czochralski growth.

The laser-heated pedestal growth method [M. M. Fejer, J. L. Nightingale, G. A. Magel, and R. L. Byer, Rev. Sci Instrum. 55, 1791 (1984)] is another method for achieving periodic poling for QPM at room temperature for frequency doubling [D. H. Jundt, G. A. Magel, M. M. Fejer, and R. L. Byer, Appl. Phy. Lett. 59, 2657 (1991)].

Materials with high nonlinearity, good optical quality, and the ability to phase match for direct frequency doubling of GaAlAs diode lasers are in demand for the development of compact sources of short-wavelength light to be used in optical storage and other applications. Lithium niobate ($LiNbO_3$) has insufficient biregringence to use conventional phase-matching techniques at these wavelengths. The capability of growing periodic ferroelectric domain structures of high spatial frequency in $LiNbO_3$ was demonstrated [G. A. Magel, M. M. Fejer, and R. L. Byer, Appl. Phy. Lett. 56, 108 (1990)].

Some technique to maintain the relative phase between the interacting waves must be employed to obtain efficient conversion in optical second harmonic generation and other nonlinear optical processes. Quasi-phase matching (QPM) was devised independently by Bloembergen, et al. [J. A. Armstrong, N. Bloembergen, J Ducuing, and P. S. Pershan, "Interactions between light waves in a nonlinear dielectric," Phys. Rev., vol 127, pp. 1918–1939, 1962.] and Franken and Ward [P. A. Franken and J. F. Ward, "Optical harmonics and nonlinear phenomena," Rev. Mod. Phys., vol. 35, pp. 23–39, 1963.] for this purpose. This invention, which actually predates the development of birefrigent phase-matching, corrects the relative phase at regular intervals by means of a structural periodicity built into the nonlinear medium. A particularly effective type of periodic structure is one in which the sign or magnitude of the nonlinear coefficient is modulated throughout the material.

Several experimental demonstrations of quasi-phase-matched optical second-harmonic generation (SHG) have been made. It was recognized early that multidomain ferroelectric crystals could show an enhancement of SHG. [R. C. Miller, "Optical harmonic generation in single crystal $BaTiO_3$," Phys. Rev., vol. 134, pp. A1313–A1319, 1964.]. Rotationally twinned crystals of ZnSe, ZnS, and other materials were considered for the enhancement of SHG by several researchers in the early 1970s. [J. Muzart, F. Bellon, C. A. Arguello, and R. C. C. Leite, "Generation de second harmonique non colineaire et colineaire dans ZnS accord de phase ('phase matching') par la structure lamellaire du cristal," Opt. Commun., vol. 6, pp. 329–332, 1972; C. F. Dewey, Jr., and L. O. Hocker, "Enhanced nonlinear optical effects in rotationally twinned crystal," Appl. Phys. Lett., vol. 26, pp. 442–444, 1975; L. O. Hocker and C. F. Dewey, Jr., "Enhancement of second-harmonic generation in zinc selenide by crystal defects," Appl. Phys. Lett., vol. 28, pp. 267–270, 1976] Levine, et al. [B. F. Levine, C. G. Bethea, and R. A. Logan, "Phase-matched second harmonic generation in a liquid-filled waveguide," Appl. Phys. Lett., vol. 26, pp. 375–377, 1975] applied a periodic electric field to liquid nitro-benzene to modulate its nonlinear susceptibility for phase matching. Alternating stacks of thin plates of CdTe [M. S. Piltch, C. D. Cantrell, and R. C. Sze, "Infrared second-harmonic generation of nonbirefringent cadmium telluride," J. Appl. Phys., vol. 47, pp. 3514–3517, 1976 (5 plates, m=5)], GaAs [A. Szilagyi, A. Hordvik, and H. Schlossberg, "A quasi-phase-matching technique for efficient optical mixing and frequency doubling," J. Appl. Phys., vol. 47, pp. 2025–2032, 1976 (2-5 plates, m=3)], [D. E. Thompson, J. D. McMullen, and D. B. Anderson, "Second-harmonic generation in GaAs 'stack of plates' using high-power $CO_2$ laser radiation," Appl. Phys. Lett., vol. 29, pp. 113–115, 1976 (1-12 plates, m=1)], quartz [M. Okada, K. Takizawa, and S. Ieiri, "Second harmonic generation by periodic laminar structure of nonlinear optical crystal," Opt. Commun., vol. 18, pp. 331–334, 1976 (up to 24 quartz laminae, and 6 $LiNbO_3$ laminae, all with large m)], and $LiNbO_3$ [M. Okada, K. Takizawa, and S. Ieiri, "Second harmonic generation by periodic laminar structure of nonlinear optical crystal," Opt. Commun., vol. 18, pp. 331–334, 1976 (up to 24 quartz laminae, and 6 $LiNbO_3$ laminae, all with large m).] were constructed by several researchers for QPM SHG experiments. In recent years, $LiNbO_3$ [Y. H. Xue, N. B. Ming, Z. S. Zhu, and D. Feng, "The second harmonic generation in $LiNbO_3$ crystals with period laminar ferroelectric domains," Chinese Phys., vol. 4, pp. 554–564, 1984.; A. Feisst and P. Koidl, "Current induced periodic ferroelectric domain structures in $LiNbO_3$ applied for efficient nonlinear optical frequency mixing," Appl Phys. Lett., vol. 47, pp. 1125–1127, 1985] and $LiTaO_3$ crystals [W. S. Wang, Q. Zhou, Z. H. Geng, and D. Feng, "Study of $LiTaO_3$ crystals grown with a modulated structure: I. Second harmonic generation in $LiTaO_3$ crystals with periodic laminar ferroelectric domains," J. Cryst. Growth, vol. 79, pp. 706–709, 1986] and single-crystal fibers [G. A. Magel, M. M. Fejer, and R. L. Byer, "Quasi-phase-matched harmonic generation of blue light in periodically poled $LiNbO_3$," Appl. Phys. Lett., vol. 56, pp. 108–110, 1990] having periodically alternating ferroelectric domain structures have been grown for application to QPM SHG. It has also been suggested that QPM may account for the surprisingly high SHG efficiencies sometimes observed in glass fibers [F. C. Farries, P. St. J. Russel, M. E. Fermann, and D. N. Payne, "Second-harmonic generation in an optical fiber by self written $\chi^{(2)}$ grating," Electron. Lett., vol. 23, pp. 322–324, 1987; R. H. Stolen and H. W. K. Tom, "Self-organized phase-matched harmonic generation in optical fibers," Opt. Lett., vol 12, pp. 585–587, 1987], and, in fact, periodic electric fields have been intentionally applied to enhance SHG in silica fibers [R. Kashyap, "Phase-matched period electric-field-induced second-harmonic generation in optical fibers," J. Opt. Soc. Amer. B, vol. 6, pp. 313–328 1989].

SUMMARY OF THE INVENTION

Multiplexing

It is an object of the present invention to provide a way of multiplexing volume holograms in electrooptic materials without the need of varying the angles of incidence, thereby eliminating the need for moving parts.

It is a further object of the present invention to provide a way of multiplexing volume holograms in electrooptic materials without the need of varying the wavelength used, thus eliminating the need for polychromatic light sources.

It is a further object of the present invention to provide a way of fixing volume holograms in electrooptic materials in a way that a single fixed hologram can be erased, written over, and fixed without affecting the other holograms.

The present invention includes methods and apparatuses for recording and reading volume holograms in electrooptic materials. These methods work by varying the material parameters, such as refractive index or crystal parameters, while keeping constant the wavelength and the angles of incidence.

Holograms can be multiplexed in a medium by varying its underlying or unperturbed refractive index. Each hologram is recorded as small perturbations of the underlying refractive index. By having the different values of this unperturbed index be far enough apart from each other, the written holograms will not be allowed to interfere with each other. Thus, several volume holograms can be multiplexed in an electrooptic material, all at the same wavelength and angles of incidence.

Three methods are disclosed for varying the material parameters or the underlying refractive index, namely (1) by applying electric field to the material, (2) by applying mechanical stress to the material, and (3) by changing the temperature of the material. Each such method will affect the material by the electrooptic, elastooptic, and piezoelectric effects, or their combination.

a) Electric field multiplexing of holograms

Holograms can be multiplexed by applying an electric field to the medium. The applied field will have a different value for each hologram.

According to this form of the present invention, a reference beam intersects a picture beam in an electrooptic material to which a voltage has been applied. A first hologram is recorded in the material this way. At a later time, the same apparatus is used, except the signal beam contains a different picture, and the applied voltage is different. Another hologram is thus also recorded in the medium. The process can be repeated several times, with each page being written at a different voltage.

A hologram can be individually selected for reading out by applying only the reference beam and the voltage on the crystal that was used to write the hologram.

b) Mechanical stress multiplexing of holograms

Holograms can be multiplexed by applying a mechanical stress to the medium. According to this form of the present invention, many holograms can be successively recorded in the material to which a mechanical stress has been applied. The mechanical stress will have a different value for each hologram.

A hologram can be individually selected for reading out by applying only the reference beam and the stress on the crystal as was used to write the hologram.

c) Temperature multiplexing of holograms

Holograms can be multiplexed by recording at different temperatures of the medium. The temperature will have a different value for each hologram. Again, a hologram can be individually selected for reading out by applying only the reference beam, while the crystal temperature would be the same as was used to write the hologram.

d) Hybrid multiplexing—demultiplexing.

Additionally, holograms written using material parameter multiplexing can be read out using angle multiplexing or wavelength multiplexing. The converse is also true.

Therefore, holograms written by multiplexing any one of the five parameters (angle, wavelength, electric field, mechanical stress and temperature) can be demultiplexed in any one of these five parameters, albeit the quality of reconstruction will be strongly dependent on the specific geometry.

Fixing

According to another embodiment of the present invention, holograms are selectively and updatably fixed while they are being recorded for the first time. Each hologram that has been written according to this embodiment of the present invention is fixed, while other holograms within the same material may still not be fixed. Holograms are fixed by being written at a very large incident beam intensity, such as 4 W/cm$^2$. The value of the incident beam intensity for hologram recording is typically that of the single originating light source, before it has been split to form the signal and reference beams and before information has been impressed upon the signal beam.

At a first sight, such a technique is counter intuitive and against what the art teaches; the art in this field is usually directed at writing holograms with as high as possible diffraction efficiency. It is common knowledge that such higher incident beam intensity will result in heating the crystal, and in recording holograms with initially a lower diffraction efficiency. Worse yet, heating of the crystal will result in a Bragg mismatch of the hologram being recorded. The phenomenon works better when the experiment is performed near the Curie temperature of the material.

The holograms resulting from this technique are (1) fixed, in that their decay time constant is substantially longer than their recording time constant, when read with a reference beam at the same wavelength, intensity, angle, and polarization as the recording reference beam. Substantially in this context typically means many orders of magnitude, but could be as little as a factor of 2. Additionally, such fixed holograms can be erased completely by overwriting. This means that such fixed holograms are (2) updatable. Further, such overwriting is (3) selective; it can be performed while not significally degrading other fixed or dynamic holograms in the material. Finally, the diffraction efficiency will increase over time and far surpass that of an equivalent dynamic hologram.

Selective Erasing of Portions of Holograms

Selectively updatably fixed holograms can also be partially erased. An original selectively updatably fixed hologram can be written in the crystal. Another hologram, containing information to be erased from the first hologram is recorded in the crystal, multiplexed with the first hologram by different applied electric field, different angles of incidence, or different wavelengths. Then an electric field of a few kV/cm is applied to the crystal for some time. Either page, when being individually read out, is missing those portions that it had in common with the other page.

Second Harmonic Generation by Optically Induced Periodic Poling

Second Harmonic Generation is accomplished by writing a selectively, updatably fixed hologram in a ferroelectric crystal. With enough time passing, the photorefractivity will be substantially eliminated and a polarization grating will be formed. For ferroelectric crystals below Curie temperature, a sufficiently large electric field may align the polarization of unit cells in the crystals. For a material such as SBN, that has a Curie temperature of 56° C. and a coercive field of 1.2 to 1.7 kV/cm, the electronic space charge field is large enough to locally induce domain reversal in the crystal. Therefore, during the writing of a volume hologram in such a crystal, the electronic grating drives the formation of a local ferroelectric domain that is a binary (0° or 180° domain) replica of the original grating for SBN, or can have intermediate values for other materials such as BaTiPO$_3$.

Volume holograms in ferroelectric and especially photorefractive materials can be written, that accomplish the same function. By having the proper spacing, the polarization grating will allow quasi phase matching, which will enable second harmonic generation and parametric amplification.

This technique is superior to the existing technology for many reasons. First, the hologram period can be designed. Many designs can be tried and erased in the same crystal. Second, the resolution of the hologram period can be as small as a tenth of a micron. Third, an anisotropic material with high birefringence is no longer necessary. Fourth, the grating extends over the entire volume of the medium. Fifth, the grating can be designed to produce SHG at normal incidence, which will facilitate a manufacturing implementation.

BRIEF DESCRIPTION OF THE DRAWINGS

FIG. 6 shows a diagrammatic comparison of the time response of the dynamic (written at low intensity) and selectively, updatably fixed (written at high intensity) readout process, for the holograms of FIG. 5a.

DETAILED DESCRIPTION OF THE INVENTION

Introduction

Figure 1:
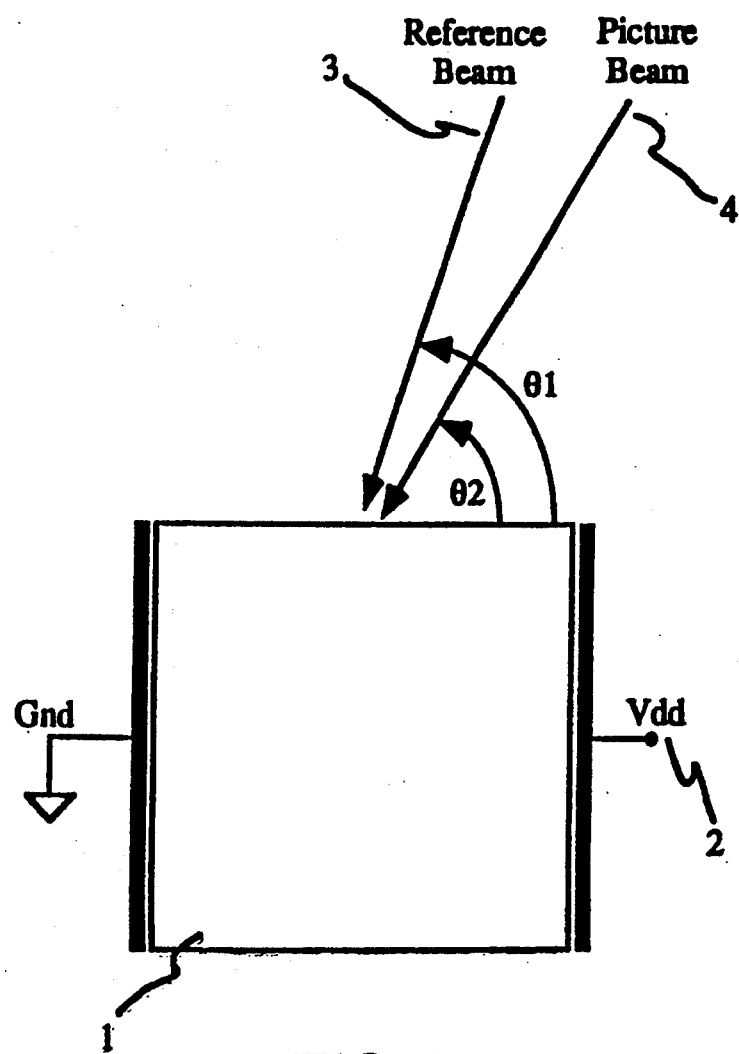
FIG. 1 shows the main components of the apparatus for electric field multiplexing and demultiplexing claimed in this invention.

A desirable goal is to have several volume holograms exist concurrently within the material, with the ability to address them individually for reading out. The usual methods to multiplex volume holograms are angular and wavelength multiplexing. These techniques exploit the dependence of the Bragg condition on the angle and wavelength of the writing beams:

$$K_g = k_1 - k_2 \qquad (1)$$

with $K_g = 2\pi/\Lambda_g$, where $K_g$ is the magnitude of the grating vector and $\Lambda_g$ is the grating period and $k_1 = k_2 = 2\pi n/\lambda$ where $k_1$, $k_2$ are the magnitudes of the reference and signal wave vectors, respectively, n is the index of refraction, and $\lambda$ is the vacuum wave length.

The index of refraction is an additional degree of freedom in the Bragg condition that can be controlled by an external electric field (S. Wu, A. Mayers, S. Rajan and F. Yu, Appl. Opt. 29, 1059–1061, (1990)).

MULTIPLEXING

The equivalence of electric field multiplexing with wavelength multiplexing

A simple relation is first derived that illustrates the formal equivalence between wavelength and electric field multiplexing. This treatment is restricted to the case of counter-propagating signal and reference beams, both normally incident on the crystal.

By differentiating the Bragg condition $\Lambda_g = \lambda/2n$, at constant temperature T and mechanical stress $\sigma$, a relation is obtained for the change $\Delta\lambda$ required to maintain Bragg matching under a field induced change $\Delta n[E]$ and $\Delta\Lambda_g[E]$:

$$\frac{\Delta\lambda}{\lambda} = \frac{\Delta n[E, \lambda]}{n} + \frac{\Delta\Lambda_g[E]}{\Lambda_g}. \qquad (2)$$

Since the index of refraction in the crystal depends on the electric field and wavelength, $$\Delta n[E, \lambda] = \Delta n[E] + \frac{dn[\lambda]}{d\lambda} \Delta\lambda. \qquad (3)$$

Substituting Equation 3 into Equation 2, and solving for the change $\Delta\lambda$, a general relationship for the change in wavelength equivalent to a field induced change of the index of refraction and grating period can be obtained:

$$\frac{\Delta\lambda}{\lambda} = \frac{1}{(1 - \lambda/n \, dn/d\lambda)} \left( \frac{\Delta n[E]}{n} + \frac{\Delta\Lambda_g[E]}{\Lambda_g} \right). \qquad (4)$$

Materials having a non zero electrooptic coefficient are called electrooptic. These materials also have non-zero elastooptic and piezoelectric coefficients. In a non-centrosymmetric crystal, the field induces an index change that is due to a combination of the electrooptic, elastooptic and piezoelectric effects (J. F. Nye, *Physical Properties of Crystals Their Representations by Tensors and Matrices*, Oxford University Press, Oxford, 1964), and may rotate the principal axes by an angle dependent on the field. A simple, yet common case in which the optical and dc fields are parallel to the field induced principal axes, and these axes do not rotate. Therefore, the index change along a principal axis is given by:

$$\Delta n[E_k] = -\frac{n_o^3}{2}[r_{lk}E_k + p_{lm}d_{km}E_k] \quad (5)$$

where $r_{lk}$, $p_{lm}$, $d_{km}$ are the electrooptic, elastooptic and piezoelectric tensors, respectively, and $l=(ij)$, $m=(np)$ in contracted notation. The field also induces strain in the crystal given by the second term on the right in Eq. (2):

$$\frac{\Delta\Lambda_g}{\Lambda_g} = d_{km}E_k. \quad (6)$$

Therefore, this multiplexing technique is based on varying the material parameters such as the index of refraction and the lattice parameters.

The equivalence of stress multiplexing and temperature multiplexing with wavelength multiplexing These parameters are also dependent on the temperature T and mechanical stress $\sigma$. A relation analogous to equation (4) is obtained upon replacing E by T or $\sigma$ for the cases of "temperature" or "stress" multiplexing. For the case of constant E and $\sigma$:

$$\frac{\Delta\lambda}{\lambda} = \frac{1}{1-\lambda/n\,dn/d\lambda}\left(\frac{\Delta n[T]}{n}+\frac{\Delta\Lambda_g[T]}{\Lambda_g}\right), \quad (7)$$

while for the case of constant E and T:

$$\frac{\Delta\lambda}{\lambda} = \frac{1}{(1-\lambda/n\,dn/d\lambda)}\left(\frac{\Delta n[\sigma]}{n}+\frac{\Delta\Lambda_g[\sigma]}{\Lambda_g}\right). \quad (8)$$

To simplify the analysis of electric field multiplexing described by Equation (4), the index dispersion $dn/d\lambda$ relative to $n/\lambda$ can be neglected. For SBN:75 $\lambda/n\,dn/d\lambda \approx 0.2$, and the approximation corresponds to an error of about 20% (E. L. Venturini, E. G. Spencer, P. V. Lenzo and A. A. Ballman, J. Appl. Phys., 39, 343-344 (1968). The second term on the right of Equation (4), the strain term, is in general of the order of $\Delta n/n$. It is convenient to define a scale factor $\xi_E$ according to:

$$\frac{\Delta n[E]}{n} + \frac{\Delta\Lambda_g[E]}{\Lambda_g} = \xi_E\frac{\Delta n[E]}{n}, \quad (9)$$

where $\xi_E$ is assumed to be a slowly varying function of the field E and typically $0 \leq |\xi_E| \leq 10$ (E. Nakamura, ed., Landolt-Bornstein, *Ferroelectric Oxides,* New Series III/28a, Springer-Verlag, Berlin, 1990, FIG. 1272), depending on the sign and magnitudes of the linear electrooptic and piezoelectric coefficients. Analogous scale factors for the temperature dependence can be defined:

$$\frac{\Delta n[T]}{n} + \frac{\Delta\Lambda_g[T]}{\Lambda_g} = \xi_T\frac{\Delta n[T]}{n}, \quad (10)$$

where $\alpha = \Delta\Lambda/\Delta T$ is the thermal expansion coefficient, and also for the stress dependence:

$$\frac{\Delta n[\sigma]}{n} + \frac{\Delta\Lambda_g[\sigma]}{\Lambda_g} = \xi_\sigma\frac{\Delta n[\sigma]}{n}, \quad (11)$$

where the first term on the left is a piezo-optical contribution and the second term is the strain $\Theta_{ij}=s_{ijkl}\sigma_{kl}$ from Hooke's law.

Hologram selectivity

The index selectivity or index half power bandwidth (the minimum index increment that would separate nearest neighboring holograms), defined as $|\Delta n|_{FWHM}$, for constant T and $\sigma$, is related to the spectral half power bandwidth of a Bragg peak (H. Kogelnik, Bell Sys. Tech. J., 48, 2909-2947 (1969)) by Equations (4) and (9), $$\frac{|\Delta n|_{FWHM}}{n} \approx \frac{1}{\xi_E}\frac{|\Delta\lambda|_{FWHM}}{\lambda} \approx \frac{1}{\xi_E}\frac{\Lambda_g}{L} \quad (12)$$

where L is the thickness of the crystal. The above expression relates the Bragg selectivity for field multiplexing to the familiar result of wavelength multiplexing. The stress and the temperature are assumed stabilized within:

$$\Delta\sigma << \frac{\xi_E}{\xi_\sigma}\Delta n_{min}\left(\frac{dn}{d\sigma}\right)^{-1}. \quad (13)$$

$$\Delta T << \frac{\xi_E}{\xi_T}\Delta n_{min}\left(\frac{dn}{dT}\right)^{-1} \quad (14)$$

Equation (14) neglects the index of dispersion. For temperature, the detuning $\delta_T$ required to decrease the diffraction efficiency by 50% from the peak value is, under constant mechanical stress and external field, and including the effects of thermal expansion $\alpha$ and index dispersion $n(\lambda)$:

$$\delta T = 2\frac{\Lambda_g}{L}\left(1 - \frac{\lambda}{n}\frac{dn}{d\lambda}\right)\left(\frac{1}{n}\frac{dn}{dT} + \alpha\right)^{-1} \quad (15)$$

Hologram capacity

Assuming the above conditions of stability, since the grating period for two plane waves in this configuration is $\Lambda_g=\lambda/2n$, the minimum index change $\Delta n_{min}=2|\Delta n|$FWHM between adjacent holograms written at the same wavelength is approximately $$\Delta n_{min} \approx \frac{\lambda}{\xi_E L}, \quad (16)$$

while the available refractive index change is given by:

$$\Delta n_{max} = \frac{dn}{dE}\Delta E_{max}. \quad (17)$$

Therefore, the number of holograms $N_{holograms}$ that can be multiplexed electrically would be given by:

$$N_{holograms} = \frac{\Delta n_{max}}{\Delta n_{min}} \approx \frac{\xi_E L}{\lambda}\frac{dn}{dE}\Delta E_{max}. \quad (18)$$

FIXING

The selective, updatable fixing process is accomplished by writing the holograms with an incident intensity greater than 1 W/cm$^2$ for a duration of at least 2 minutes. This selective, updatable fixing is not necessarily of the same type as has been reported so far. First, it does not require an additional process step such as an external electric pulse to be applied after a dynamic hologram has been written. The hologram becomes fixed while it is being written. Second, unlike fixed holograms that have been reported so far, a selectively, updatably fixed hologram can be erased completely by overwriting. Third, unlike the multiplexed fixed holograms that have been reported so far, any one of the herein disclosed selectively, updatably fixed holograms can be selectively erased, while leaving the others substantially intact.

Holograms become selectively, updatably fixed if they have been written preferrably under the conditions of (a) temperature (T) lower than, but approaching the Curie temperature ($T_c$), (b) high beam intensity, (c) long exposure.

Macroscopically and initially, selective updatable fixing appears to be an intensity threshold phenomenon, whereas it probably is an energy threshold phenomenon. If the intensity is large enough, the necessary time exposure can be short enough. The product of (b) and (c) above suggests that the quantity of interest is the deposited energy. The deposited energy would have to be larger than some threshold. The threshold would be a function of the material, $T_c-T$, and possibly intensity and/or time of exposure. It is therefore speculated that holograms written with beams of low intensity and for a long enough time would also eventually become selectively, updatably fixed.

It is believed that these holograms are formed by light induced local ferroelectric domain formation, unlike the space charge migration that is responsible for dynamic holograms. Because ferroelectric domain formation involves the displacement of ions of relatively large mass and low mobility, these holograms exhibit substantially more persistence to readout, which is macroscopically perceived as fixing. Ionic domain formation occurs more readily near (but still below) the Curie temperature, because the thermal activation energy for domain reversal is lower. Prior such holograms, even if accidentally written, would not have been appreciated for the fact that they are fixed, completely overwritable, and selectively updatable.

Fixing of dynamic holograms requires the compensation of electron space charge by the ferroelectric domain pattern. In contrast, the development stage in this selective updatable fixing technique occurs simultaneously with the writing or exposure stage.

Figure 5:
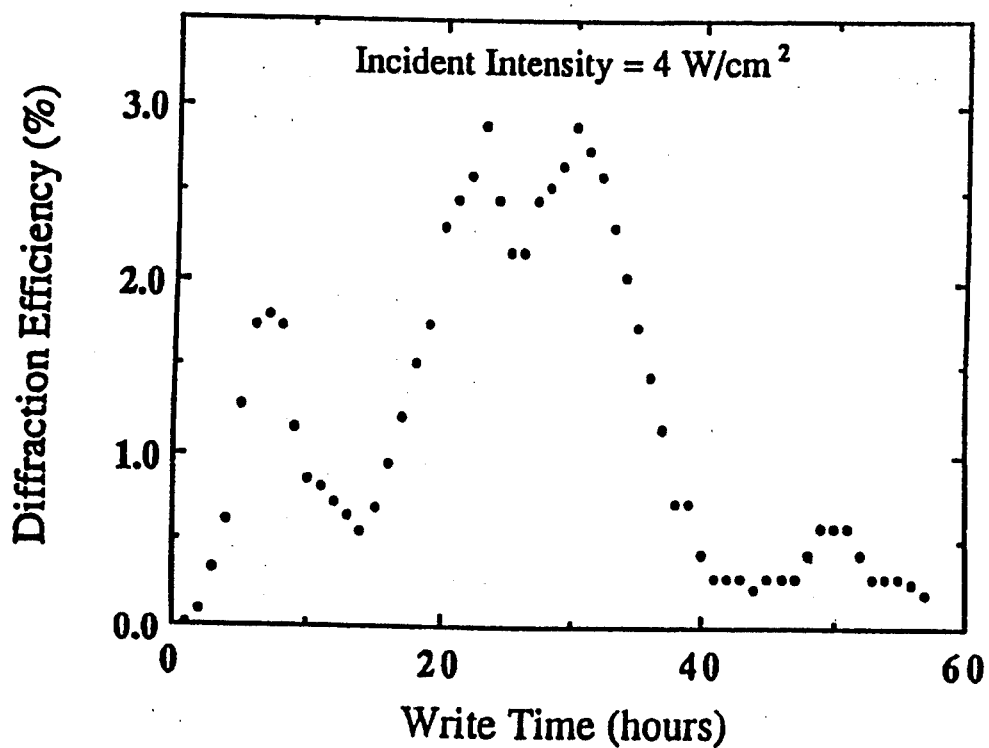
FIG. 5 shows a diagram of the diffraction efficiency of a selectively, updatably fixed hologram during an extended writing process at high incident beam intensity.
Figure 5A:
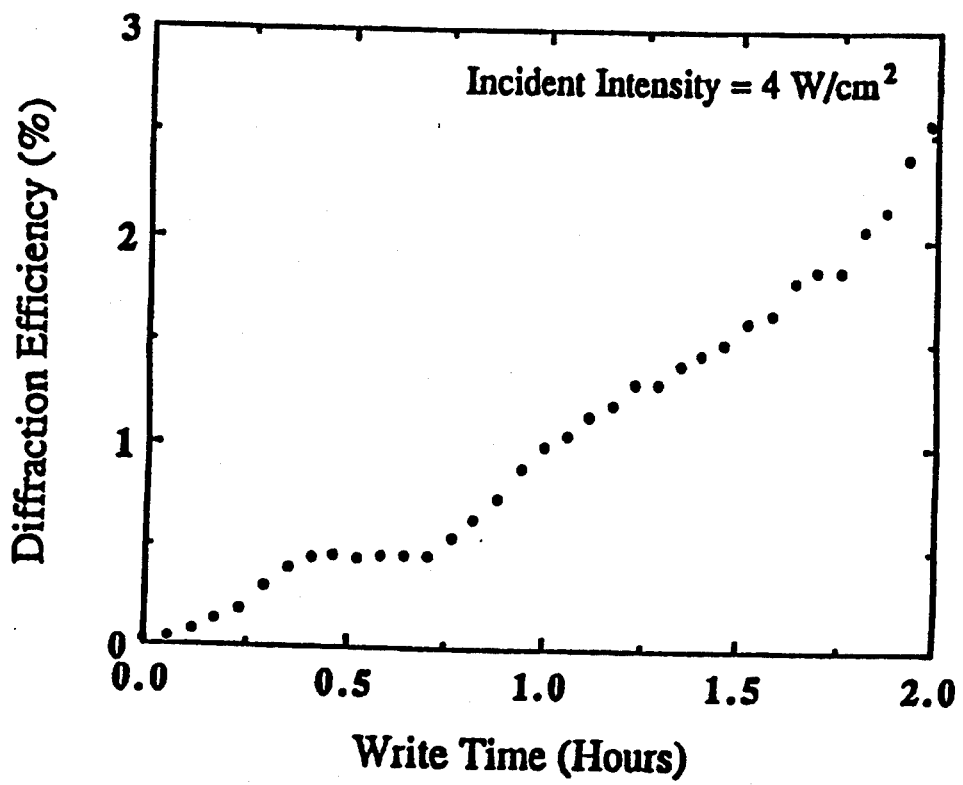
FIG. 5a shows a diagram of the first few hours of FIG. 5.

An increased incident beam intensity, temperature (while $T<T_c$) or write time all tend to enhance the diffraction efficiency of the fixed hologram. As seen in FIG. 5a, the diffraction efficiency first grew monotonically from 0.1% to 2.5% during a writing process of 2 hours. But, for an exposure of 40 hours, the diffraction efficiency has decreased again, which is evidence of the domain reversal. As a consequence of the domain reversal, the $r_{33}$ linear electrooptic coefficient has decreased from 1400 pm/V to 130 pm/V after writing the hologram (FIG. 5).

Figure 5B:
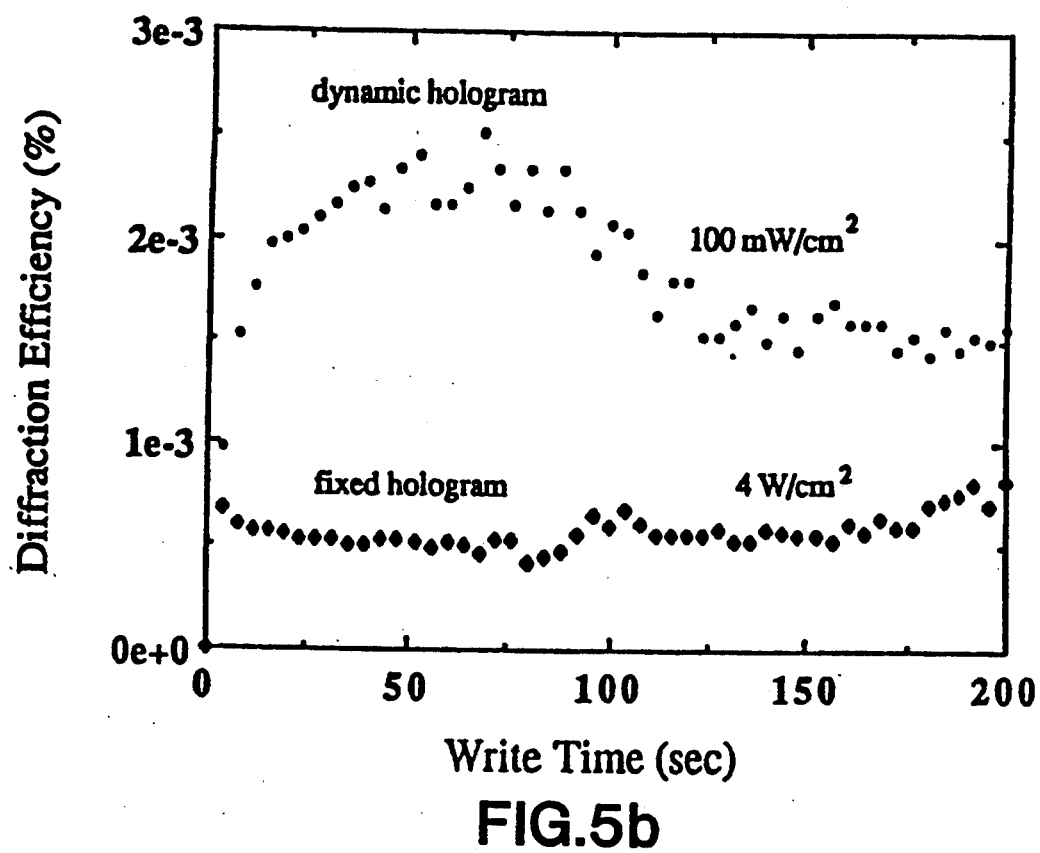
FIG. 5b shows a diagram of the first 200 seconds of FIG. 5. The time responses of the low and high intensity writing processes are shown.

FIG. 5b compares the time dynamics during the writing of a dynamic and a selectively updatable fixed grating. For a total intensity of the signal and reference beams of 100 mW/cm$^2$, only a dynamic grating is present, displaying a characteristically fast rise time. With an increased intensity of 4W/cm$^2$, the hologram diffraction efficiency monotonically increases (but very slowly) to a larger value. This figure best illustrates why this version of the invention is contra to what the prior art teaches. The dynamic grating diffraction efficiency builds up more rapidly, because it is composed of faster moving space charge electrons, as opposed to a process involving lower mobility ions, such as ferroelectric domain formation.

Figure 6:
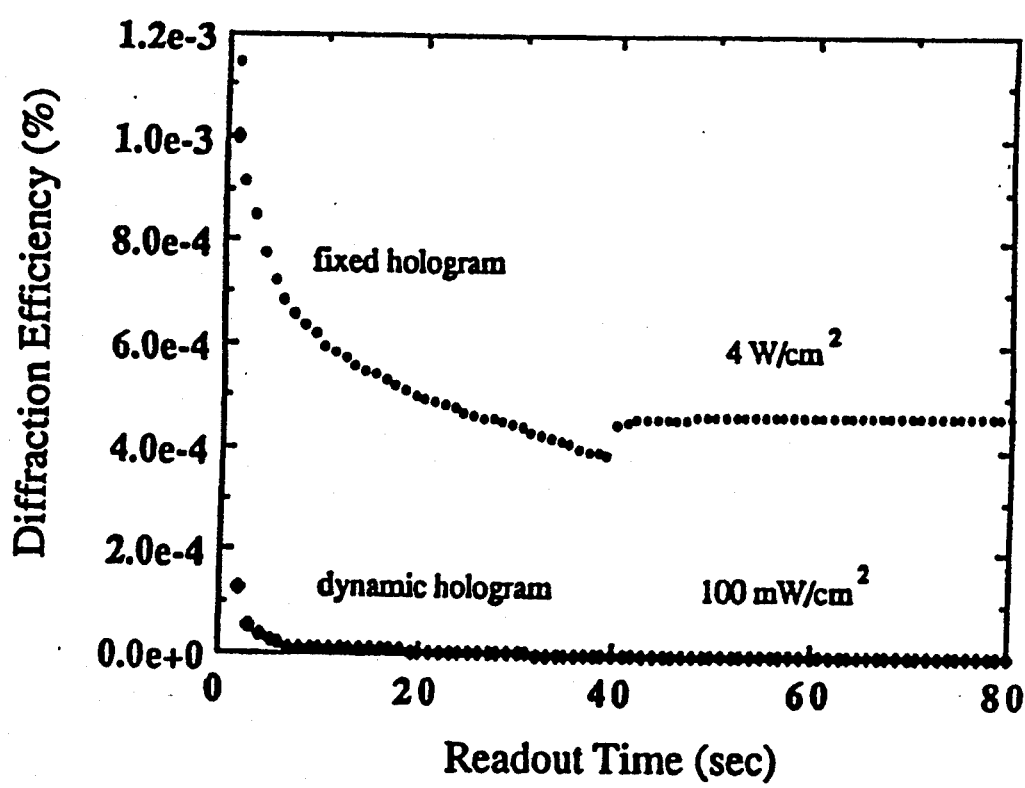

Holograms written this way are automatically fixed during the recording stage. In FIG. 6 it can be seen that an equivalent dynamic hologram disappears completely after only 7 seconds of readout. However, the diffraction efficiency of the fixed hologram decays for 40 seconds, and then discontinuously settles into a steady state. This behavior is contrary to earlier fixing techniques, in which the diffraction efficiency initially grows during readout.

Figure 7:
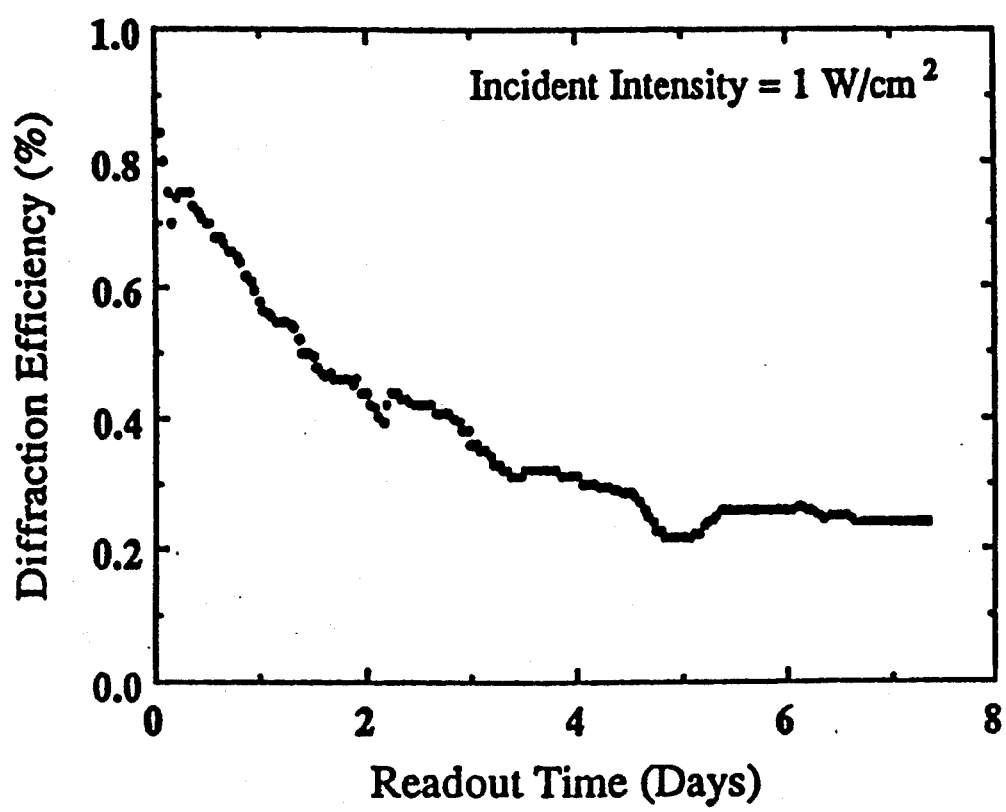
FIG. 7 shows a diagram of the diffraction efficiency of a selectively, updatably fixed hologram under intense readout illumination.
Figure 8A:
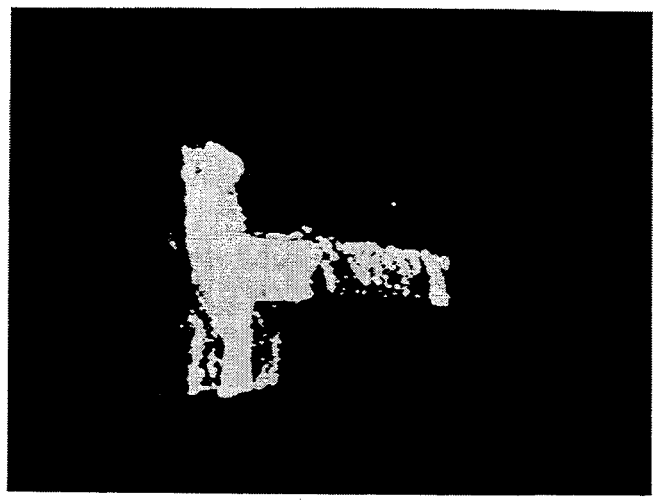
FIG. 8a-8f demonstrate the selective overwriting of a single one ("c") of three selectively, updatably fixed multiplexed volume holograms in a crystal ("a" "b" and "c") Hologram "c" has been overwritten by "f", leaving "a" and "b" slightly degraded as "d" and "e" respectively.
Figure 8B:
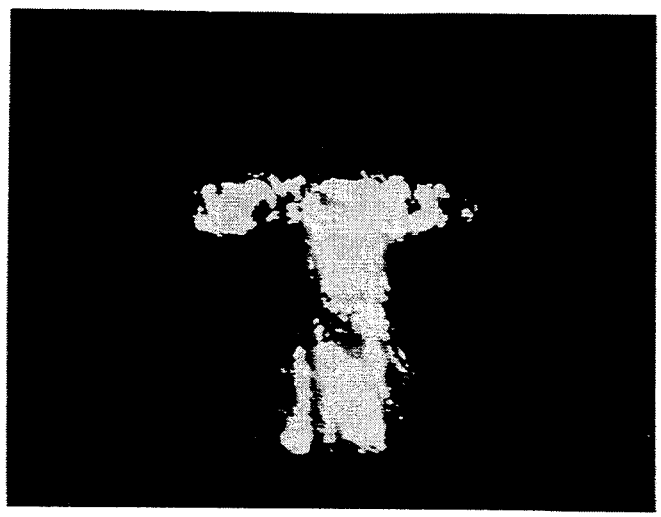
Figure 8C:
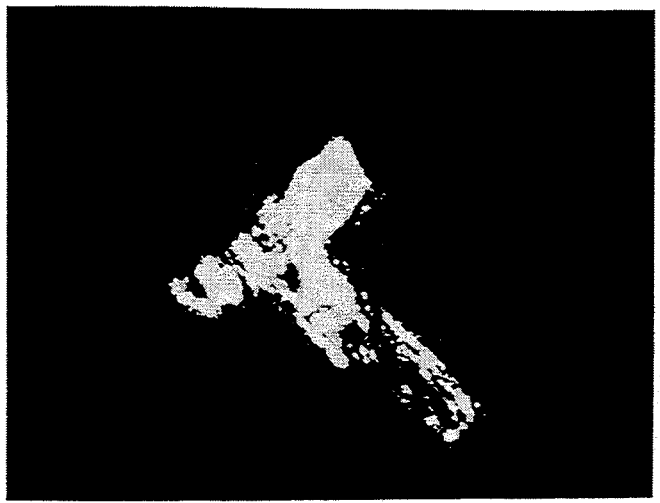
Figure 8D:
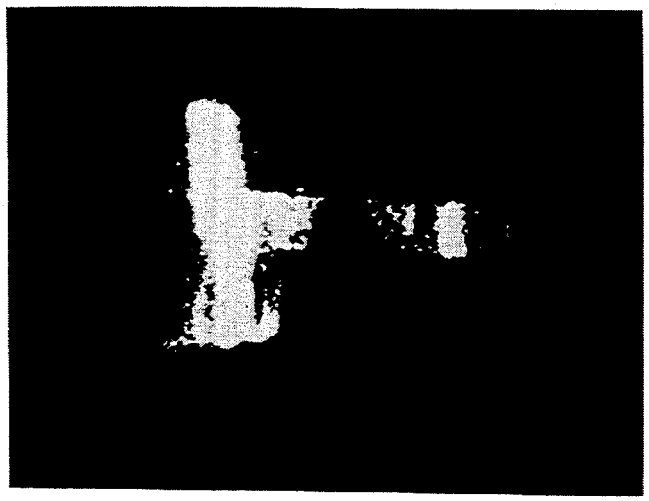
Figure 8E:
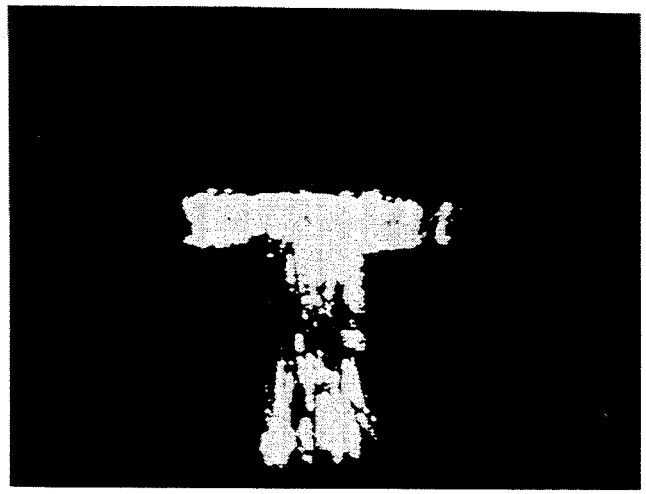
Figure 8F:

FIG. 7 illustrates the long term decay of a fixed hologram written for one hour at room temperature with a total intensity of 4 W/cm$^2$. The hologram was continuously reconstructed with an intense beam of 1 W/cm$^2$. The diffraction efficiency diminishes by a factor of three during the initial four days of readout, and then reaches a steady state value. Extrapolating this curve, it was estimated that the hologram will survive several hundred days during continuous readout, before falling below the noise threshold. Naturally, the fixed hologram lifetime was found to vary inversely with the intensity of the readout beam.

An advantage of this fixing technique is the ability to address an individual page and selectively write over only one hologram. FIG. 8 demonstrates the selective overwriting of a single one ("c") of three selectively updatably fixed multiplexed volume holograms in the crystal ("a" "b" and "c") Hologram "c" has been overwritten by "f", leaving "a" and "b" with a slightly degraded image and about half the efficiency as "d" and "e" respectively

SELECTIVE ERASURE OF A PORTION OF A SELECTIVELY UPDATABLY FIXED HOLOGRAM

The light induced domain pattern is a selectively, updatably fixed hologram. Each such hologram is distributed within the entire volume of the crystal, sharing the same pool of dipoles. Each hologram is a local depolarization of the poled crystal. Those regions in the crystal with a significant depolarization may be completely depoled by applying a negative bias electric field, leaving those regions with only slight depolarization unchanged. The portions of the hologram where significant depolarization has occurred (i.e. where two holograms have been written) will then be depoled and erased. Therefore, individual holographic pages or pixels may be selectively updated.

Figure 9A:
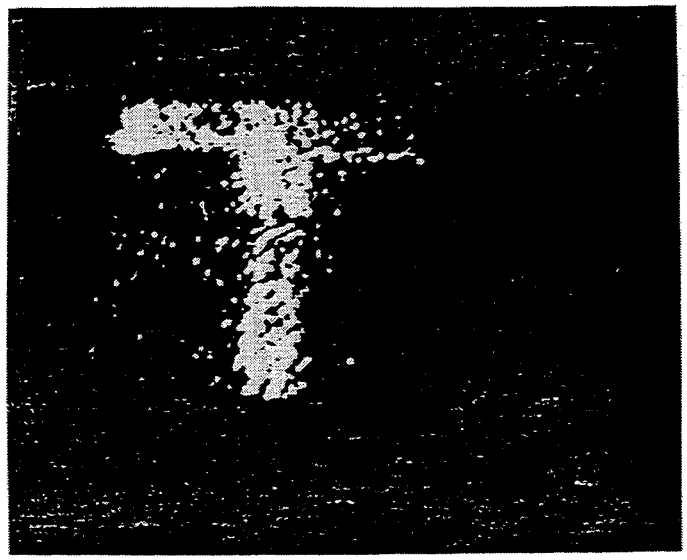
FIG. 9a-9c demonstrate the selective erasure of a portion of a single volume hologram ("a"), which has been written at 0 V. After a pulse of −2000 V has been applied to the crystal, the page written at +1000 V ("b") has been subtracted from "a", leaving "c" that can be read at 0 V.
Figure 9B:
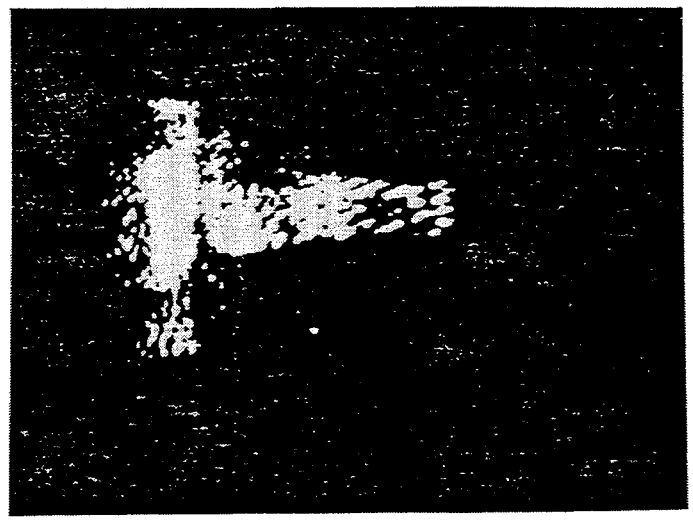
Figure 9C:

In FIG. 9, selectively updatably fixed hologram a) has been written at 0 V, and selectively updatably fixed hologram b) has been written at 1000 V. Then a pulse of −2000 V was applied, which in fact erased the portion each page had in common with the other.

SECOND HARMONIC GENERATION IN PHOTOREFRACTIVE MEDIA BY OPTICALLY INDUCED PERIODIC POLING.

The light induced periodic poling allows ferroelectric domain patterns with periods of the order of 0.1 $\mu$m to be formed. Periodically poled crystals may be used to achieve quasi-phase-matching in optical second harmonic generation and parametric amplification. For instance, the phase matching condition that must be satisfied to convert a significant fraction of the light to the second harmonic is a momentum conservation relation $$k^{(2\omega)} = 2k^{(\omega)} \tag{19}$$

where $k^{(\omega)}$ and $k^{(2\omega)}$ are the wavevectors of the fundamental and the second harmonic, respectively. In terms of the index of refraction, $$n(2\omega) = n(\omega) \tag{20}$$

The technique of quasi-phase-matching introduces a structural periodicity in the crystal to match the phase velocities of the fundamental and second harmonic. First order quasi-phase-matching is achieved when the periodicity of the spontaneous polarization is equal to the coherence length $l_c$, defined as the distance over which the relative phase of the two waves changes by $2\pi$:

$$l_c = \frac{\lambda}{2(n(2\omega) - n(\omega))} \tag{21}$$

where $n(\omega)$ is the refractive index of the generating wave in the material, and $n(2\omega)$ is the refractive index of the generated second harmonic wave in the material. The coherence length $l_c$ is a measure of the maximum crystal length that is useful in producing the second harmonic power. It can be seen from equations 20 and 21 that perfect phase matching corresponds to a coherence length of infinity.

It is desirable to use the lowest order ($m=1$) of phase matching, because the conversion efficiency is proportional to $1/m^2$. First order phase matching is optimal, and therefore, the period of poling should be equal to $l_c$.

Optically induced poling by recording a volume hologram does not require that the beams be at high intensity. The technique has the advantage that the period may be adjusted simply by varying the angle between the interfering beams, during the writing process. In addition, several periodicities may be recorded in the volume to allow phase matching at several wavelengths. While this process is outlined for quasi-phase-matching of the second harmonic, this technique is applicable to all other parametric processes, i.e. generation of sum and difference frequencies.

An advantage of this technique is that the same material can be adapted for different wavelengths. However, this technique does not work optimally with electric field multiplexing for mass storage applications, because the electric field causes the material to lose its poling.

An optically induced superlattice has thus been created. Because the period of poling is determined by an optical interference pattern, very small periods (less than 1 μm) are easily attained, facilitating QPM at shorter wavelengths.

PREFERRED EMBODIMENT MULTIPLEXING

Given the many parameters of the hologram multiplexing version of this invention, there is no single best embodiment. What the preferred embodiment is seems to always be determined by the context and the desired objective. For example, for hologram multiplexing and demultiplexing, the largest number of holograms will probably be produced by stress multiplexing in SBN, while the structure will be the hardest to set up. The least number of components will probably be required in temperature multiplexing, because there will be no need for electrodes or piezoelectric transducers, while there will always be a need for temperature control. However, switching rates based on temperature multiplexing are slow, due to the slow, defusive nature of heat flow.

For hologram multiplexing, electric field multiplexing is apparently a compromise of choice. The apparatus is relatively easy to set up. The value of the field may be calculated accurately, and it is simple to rapidly switch from one value of the field to another. For electric field multiplexing, there are further materials considerations and geometry considerations.

a) Materials considerations

To maximize the number of holograms $N_{holograms}$ that can be multiplexed electrically, the material must satisfy two primary requirements. The material must have at least one large electrooptic coefficient that induces a significant index change for an electric field (I) along $\vec{K}_g$ for beam coupling and (II) along $\hat{e}_1$, $\hat{e}_2$ (the polarization vectors of the reference and signal) for electrically biasing the index of refraction.

In addition there are three conditions of secondary importance: it is desirable that the field does not rotate (III) the polarization or (IV) the principal axes, and (V) the material should have a large piezoelectric tensor component $d_{km}$ of the proper sign so that $\xi_E$ is maximized. Failure to satisfy conditions (III) and (IV) will reduce the beam coupling because the polarization of the two beams will no longer remain parallel and in the desired condition (II), as they propagate through the crystal. The best material for electric field multiplexing is SBN, primarily due to its large electrooptic coefficient. For hybrid multiplexing—demultiplexing applications, the choice of material may determine whether the reconstructed page will be partially spatially distorted.

For selective updatable fixing of holograms, ferroelectric materials that exhibit a strong photorefractive effect should be considered. They enter the paraelectric phase when they are at a temperature T higher than their Curie temperature, $T_c$. The procedure of poling a crystal ensures that the electrical dipoles within the crystal are in single domain, i.e. all aligned. At a temperature close to $T_c$ the ion mobility is increased. Above $T_c$ the electric dipoles become randomly oriented.

Having a ferroelectric phase means there is spontaneous polarization, which means there is photorefractive effect. Some suitable ferroelectric materials are LiNbO₃, BaTiO₃, and SBN. Some paraelectric materials (i.e. materials with $T_c$ below room temperature) are potassium tantalate niobate (KTN) and KLTN.

In LiNbO₃, $T_c = 1200°$ C. the poling does not degrade at room temperature, since the polarized state becomes more stable as the temperature is decreased below $T_c$. For SBN, $T_c = 56°$ C.; it is possible to operate near $T_c$, by being at the usual room temperature of 25° C. to 30° C. or a little higher. (If temperature control is lost and $T_c$ is exceeded, the poling would be lost and would need to be restored.) Therefore, SBN:75 is a preferred medium for this fixing process.

Geometry Considerations

The optimum geometry for electric field multiplexing is one with counter-propagating signal and reference beams normally incident on the crystal. This configuration has two primary advantages. First, the counterpropagating configuration exhibits inherently low crosstalk and high wavelength selectivity (G. A. Rakuljic, V. Leyva, A. Yariv, Opt. Lett. 17, 1471-1473 (1992)). Second, it eliminates the detrimental Snell's law dependence of the beam angles within the crystal on the refractive index of the crystal. A given change of index does not induce as large a change in the grating vector for oblique incidence. In fact, for the transmission geometry with equal angles of incidence, the index dependence of the Bragg condition disappears:

$$2\Lambda_g n_{crystal} \sin\theta_{crystal} = 2\Lambda_g \sin\theta_{air} = \lambda. \quad (19)$$

It should be noted, however, that the Bragg condition retains its field dependence $\Lambda_g[E]$ even in this case. In the optimal counter-propagating normally incident geometry discussed above, electric field multiplexing is closely related to wavelength multiplexing (except that the photorefractive beam coupling and phase are now field dependent (M. Cronin-Golomb, B. Fischer, J. O. White, and A. Yariv, IEEE J. Quant. Elect., QE-20, 12-30 (1984)) and the field induces a strain).

The optimum geometry depends on the material used. It is desirable to use the strongest electrooptic coefficient. For experimental conditions, this may also depend on the cut of the crystal. In SBN:75, the $r_{33}$ coefficient is preferable to the $r_{42}$ coefficient. This dictates that the electric field be applied along the c axis, and the polarization vectors of the reference and signal beams lie in the same plane as the vector of the electric field.

In the optimal reflection grating geometry, $N_{holograms}$ can be estimated from Equation (18). For typical parameters ($\lambda_o = 0.5$ μm, $L = 1$ cm), and for extraordinarily polarized signal and reference beams, and estimating $\xi_E \approx \xi_T \approx 1.25$, Eq. (16) yields $\Delta n_{min} = 4 \times 10^{-5}$. This implies from Eq. (14) that for a material such as SBN:75 with $dn/dT = 2.5 \times 10^{-4}$ the temperature must be stable to within $\delta T << 0.16°$ K. at 300° K. Since $r_{33}$ is the only significant electrooptic coefficient in SBN:75, the optimal geometry is a compromise to simultaneously satisfy both conditions (I) and (II), as in FIG. 1. This configuration also satisfies conditions (III) and (IV). The total index tuning range in the optimized configuration is approximately $\Delta n_{max} = 0.0025$, half of $\Delta n_{max} = 0.005$ (J. B. Thaxter and M. Kestigian, Appl. Opt., 13, 913-924 (1974)) for a material such as SBN:75. Then the number of holograms that may be electrically multiplexed around $\lambda_0$ in SBN:75 is calculated from Equation (18) to be approximately 60.

For fixing, higher diffraction efficiencies will be attained if the facets of an SBN: 75 crystal have been cut perpendicularly to the principal axes.

Typical apparatus 25 Referring to FIG. 1, volume holograms can be recorded in an electrooptic material 1, having an index of refraction n. The material is ideally enclosed in a temperature controlled vacuum (structure not shown) for thermal isolation. A voltage $V_{dd}2$ is applied along the c axis (<001> direction) of the material during the photorefractive recording process. The optimum orientation is determined by the specific material, as discussed above. The voltage establishes an electric field within the material, which in turn biases the underlying value of the refractive index of the material. A reference beam 3 impinges on the material 1 at an angle $\theta_1$ and a signal beam 4 impinges on the material at an angle $\theta_2$. The reference beam and the signal beam are coherent, as they are obtained from the same light source (not shown on drawings). The interference pattern of the reference beam and the signal beam occurs within the volume of the material.

Figure 2A:
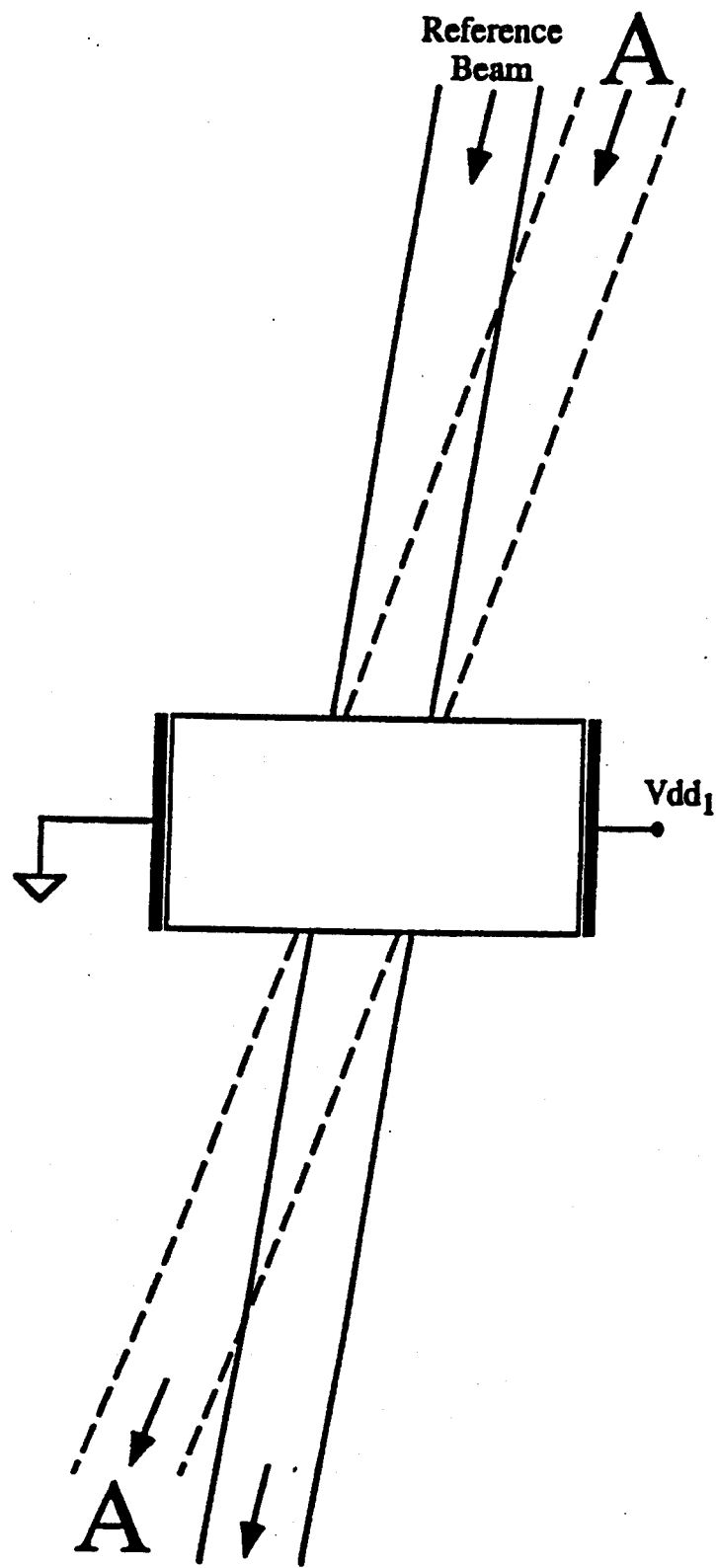
FIG. 2a and FIG. 2b show diagrammatic illustrations of the apparatus for electric field multiplexing in a configuration for writing holograms.

As shown in the example of FIG. 2a, a first hologram is recorded in the material when the voltage has the value $V_{dd1}$ and the signal beam carries the letter "A" as the picture (or page) to be recorded.

Figure 2B:
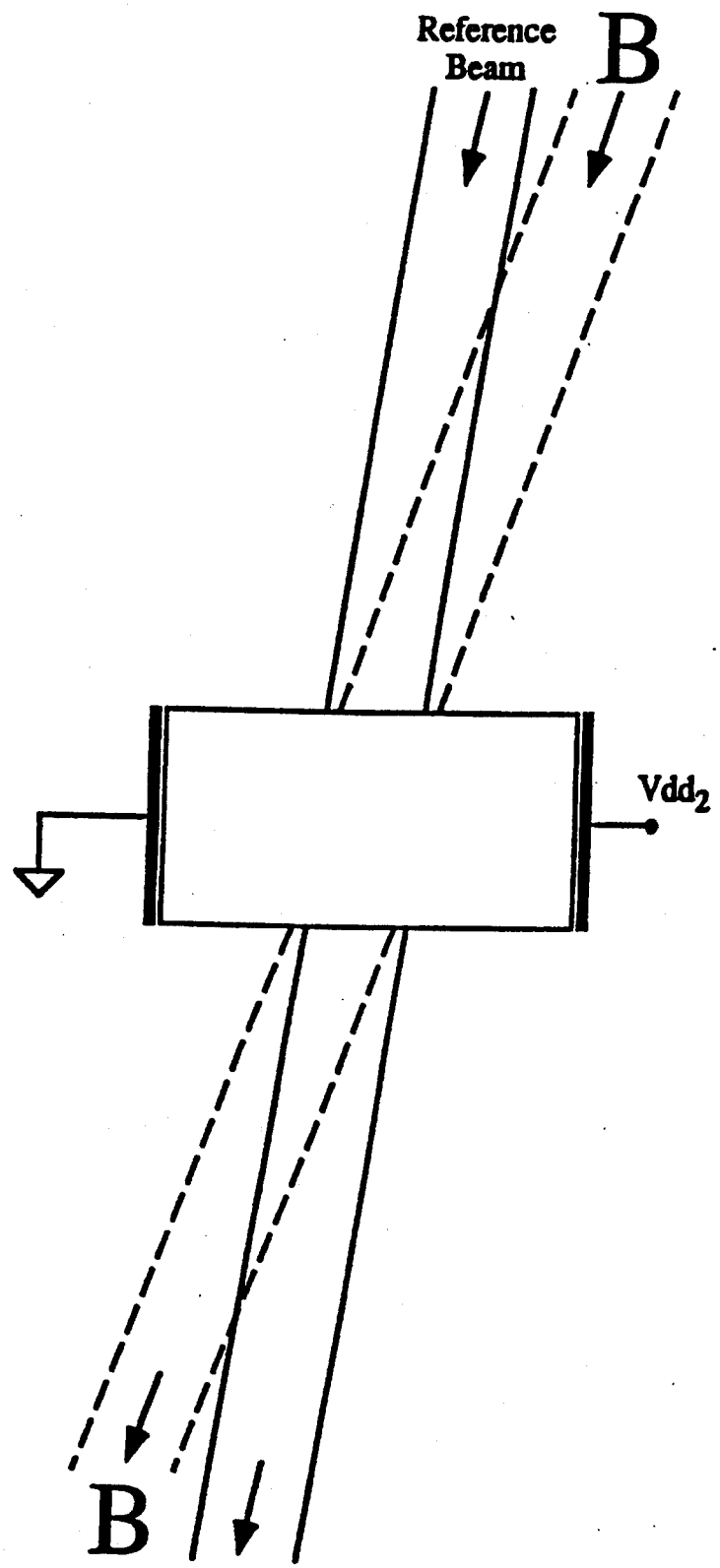

At a later time, the same apparatus is used, except the signal beam contains different information (the letter "B"), and the applied voltage is different ($V_{dd2}$), as shown in FIG. 2b. Another hologram is thus also recorded in the medium. The process can be repeated several times, with each hologram being recorded at a different voltage.

Figure 3A:
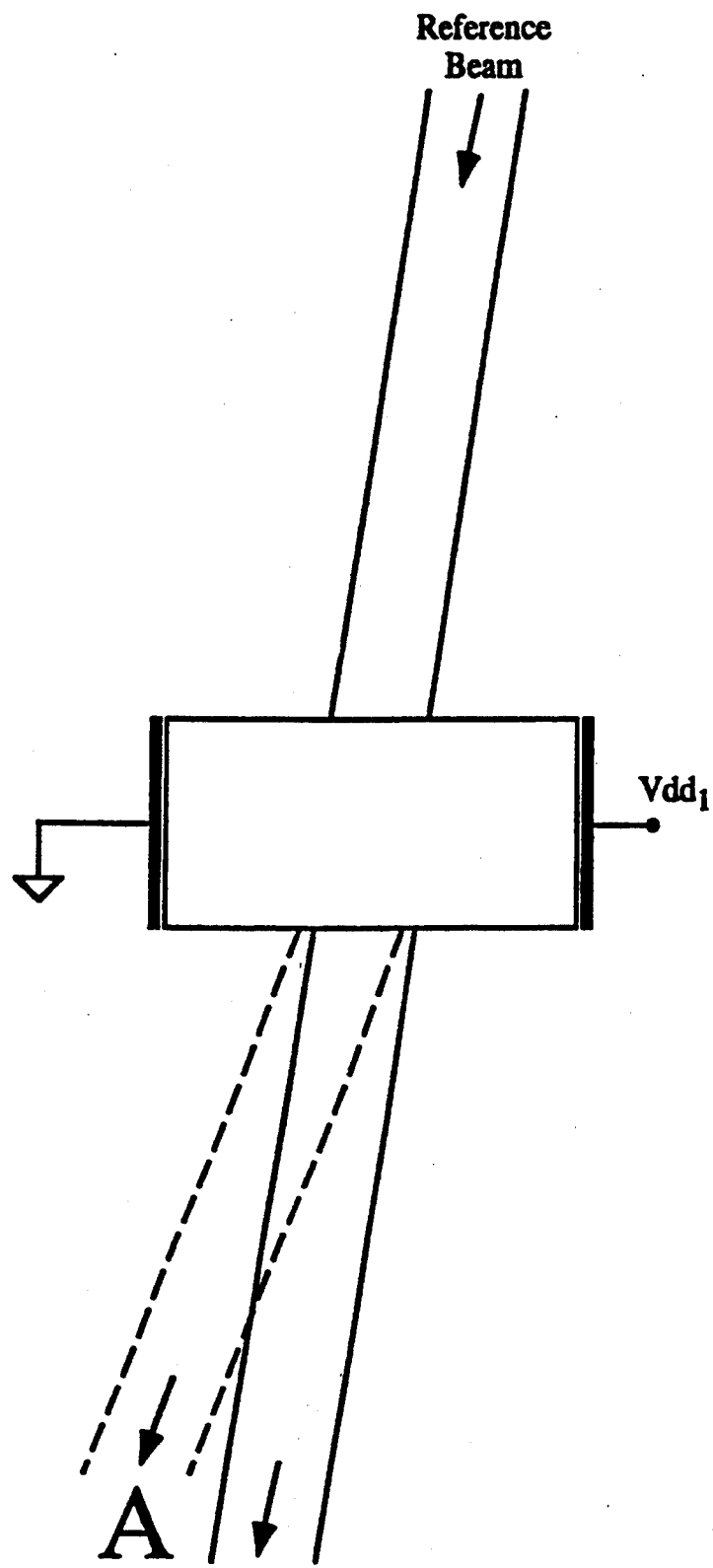
FIG. 3a and FIG. 3b show diagrammatic illustrations of the apparatus for electric field demultiplexing in a configuration for reading holograms.
Figure 3B:
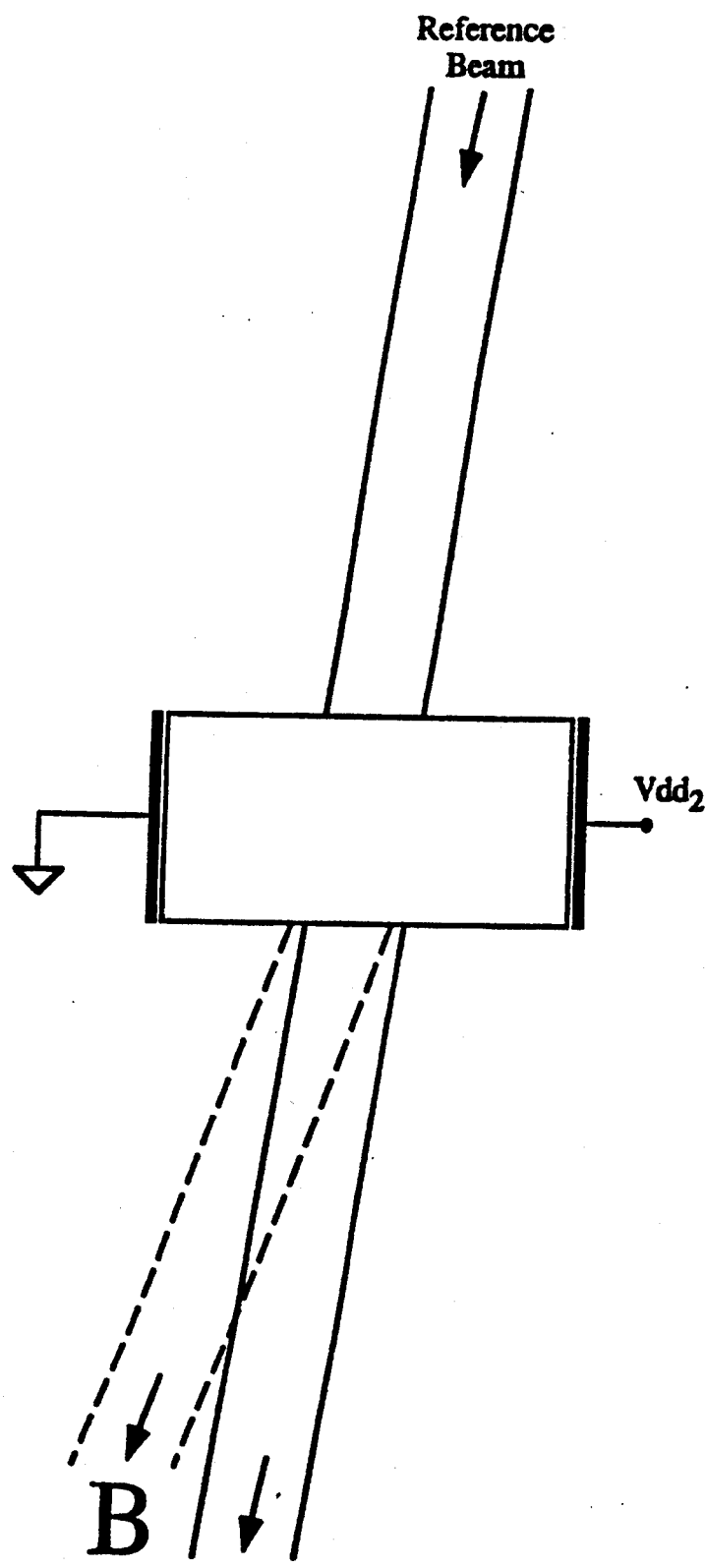

For reading out the holograms, only the reference beam and the voltage are applied. As seen in FIG. 3a, by applying the same reference beam and the voltage $V_{dd1}$, the first signal beam (letter "A") will be reconstructed. (Note that $V_{dd1}$ was the same voltage as was used to record the letter "A".) Similarly, as seen in FIG. 3b, by switching the value of the voltage from $V_{dd1}$ to $V_{dd2}$, the letter "B" is produced instead.

Figure 4:
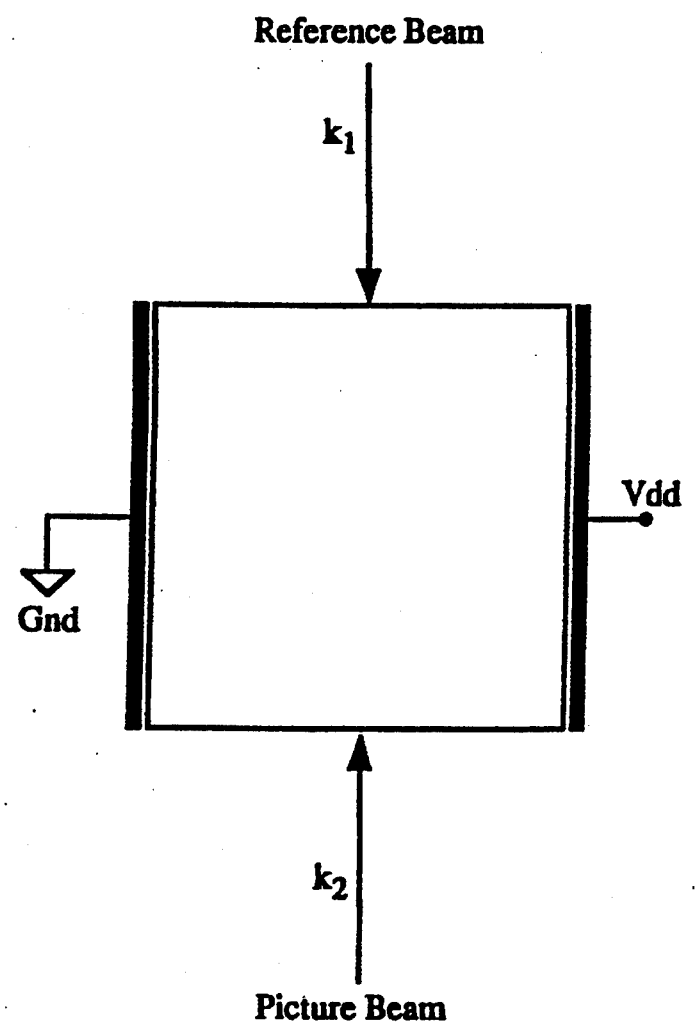
FIG. 4 shows the apparatus for electric field multiplexing with counter propagating reference and signal beams.

A preferred embodiment for multiplexing volume holograms is with counterpropagating reference and picture beams, as is shown in FIG. 4.

In conclusion, the addressing of individual holograms is demonstrated by varying the applied electric field. This method can be used either independently or in conjunction with the other addressing methods (such as varying the angle $\theta_1$ of the reconstruction beam) to fine tune the Bragg condition.

Other embodiments of this version of this invention would be similar. Mechanical stress can be applied by piezoelectric elements or by other mechanical means positioned against the photorefractive material, for stress multiplexing. A radiating or conducting heat source can change the temperature of the crystal, for temperature multiplexing.

SELECTIVE UPDATABLE FIXING

For fixing, a convenient way to measure the diffraction efficiency $\eta$ is $I_s/I_r$, where $I_s$ is the intensity of the diffracted beam, and $I_r$ is the intensity of the remnant readout reference beam. This formulation is convenient because it takes into account reflection and absorption loses. [Angles of incidence that generated drawings 5, 5a, 6, 7 and 8 where 16°; the absorption coefficient of SBN:75 is 1.9 cm$^{-1}$.] The formulation is also a good approximation, considering that $\eta$ is less than 3%, so $I_s << I_r$.

Excellent fixed holograms are obtained at a wavelength of 488 nm in the transmission grating configuration, at or about room temperature. A problem with this technique is that an SBN:75 crystal can heat up by 1° C. to 5° C. during a 30 minute writing process. Therefore, each hologram would correspond in fact to many closely spaced (in k-space) holograms, effectively broadening the Bragg peak. The effect may be diminished by actively stabilizing the crystal temperature. In general, it is not possible to compensate for anisotropic, thermally induced Bragg mismatch by simply adjusting the incident angle of the reference beam. The writing temperature must be identical to the readout temperature to maintain strict Bragg matching of all spatial frequencies in a holographic image. In fact, fixing techniques where writing is performed at a different temperature than readout may suffer from a degradation in image quality and diffraction efficiency. The selective updatable fixing technique reported here has the advantage that both the fixing and the readout process occur near room temperature to begin with, and will work very well with thermal stabilization.

The material should be ferroelectric and preferably photorefractive, and have a Curie temperature slightly above the operating temperature. It should have electrodes on two opposite faces of the crystal for applying a few kVs of potential across the crystal.

SELECTIVE ERASURE OF A PORTION OF A SELECTIVELY UPDATABLY FIXED HOLOGRAM

For erasing part of the page, the preferred apparatus is one where the material is ferroelectric and preferably photorefractive, with electrodes on two opposite faces of the crystal for applying a few kVs of potential across the crystal.

SECOND HARMONIC GENERATION IN PHOTOREFRACTIVE MEDIA BY OPTICALLY INDUCED PERIODIC POLING

For second harmonic generation (also known as frequency doubling) and parametric amplification, the apparatus is well known in the art. The apparatus for periodic poling of the crystal is a typical one of writing holograms. The reference and signal beams are preferably both plane waves, that is, they contain no information. Preferably, but not necessarily, the holograms are written at high intensity, and possibly with active thermal stabilization, to deal with the heating problem. The holograms would be recorded for a long time, until the photorefractive effect is depleted, and the grating is a variation on polarization with a large modulation depth.

The material should be ferroelectric and preferably photorefractive, and have a Curie temperature slightly above the operating temperature.

APPLICATIONS

Hologram multiplexing by electric field or otherwise can be used as memory elements in computers. They may be advantageous where the amount of the information stored is large, and electronic access times are prolonged due to the amount of the information being large. The invented technique would provide parallel access, which would keep the access times relatively lower.

The multiplexing version of the present invention can also be used in combination with other holographic arrangements, such as space division multiplexing. One such storage medium could be an element of a larger scheme to store many holograms.

Hologram multiplexing can also be used for reconfigurable optical interconnects. In one embodiment, a source would emit light towards a holographic optical element. By tuning the material appropriately, the optical element would focus the light on different photodetectors. This method could be used for inter chip communication.

The techniques disclosed herein can also be used to continuously tune the wavelength about multiple discrete laser lines within the crystal itself, effectively eliminating the need for a continuously tunable laser for holographic data storage applications, and to make tunable holographic lenses (by writing many holograms close together, in k-space so that at least one hologram is Bragg matched at all times). Further, tunable, extremely narrow band spectral filters can also be made.

Given the temperature dependence, a thermometer can be envisioned. Many holograms can be temperature multiplexed. Each page would be a picture of the number representing the temperature that was used to write the hologram. A reference beam would reconstruct a signal beam that would always show digitally the crystal temperature. A stress meter at constant temperature can also also be designed.

Figure 10:
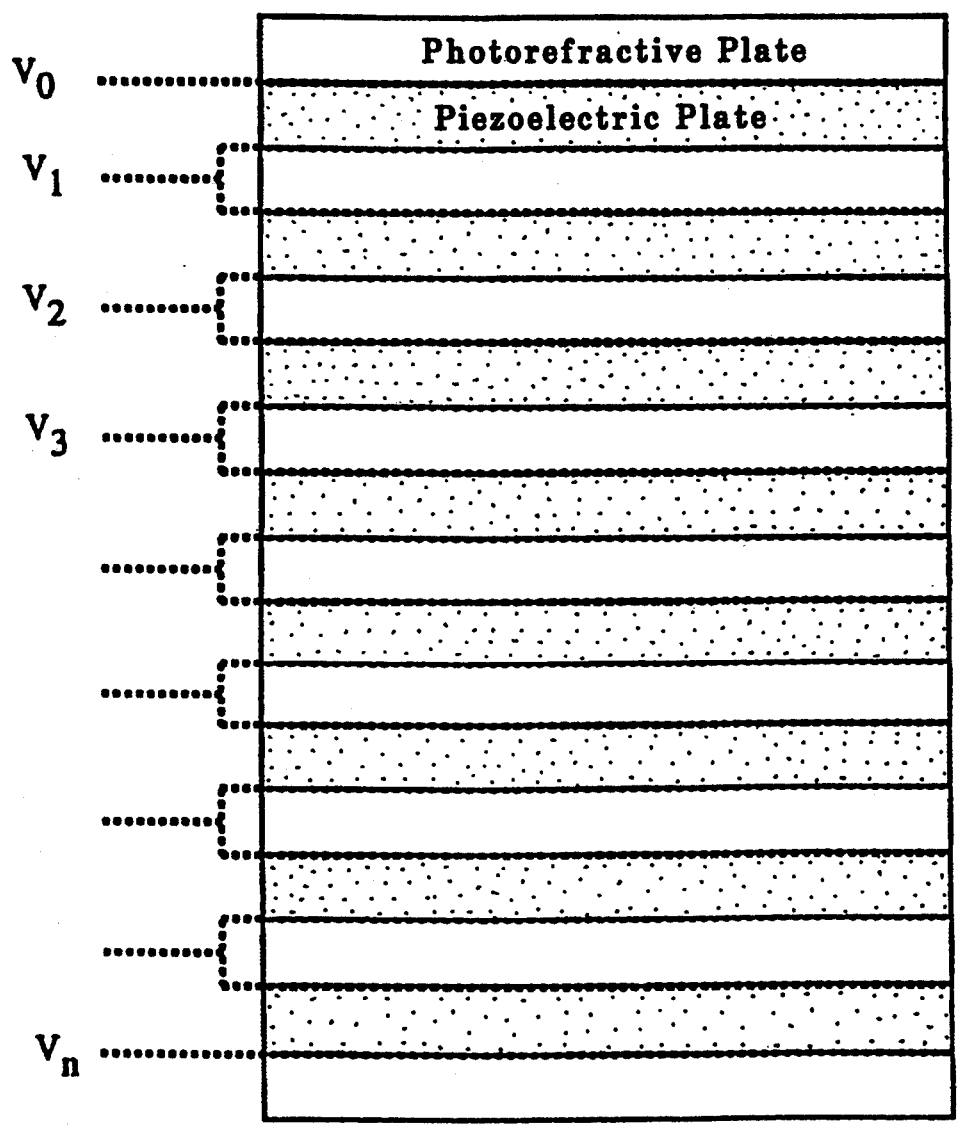
FIG. 10 shows a proposed hybrid embodiment of stress multiplexing.

Additionally, a hybrid embodiment of stress multiplexing is a material comprising alternating thin layers of photorefractive and either piezoelectric or highly pliable sheets, thus forming a stacked structure as shown in FIG. 10. This relaxes the material requirements, since the photorefractive sheets are used only to store the hologram, while the interstitial material is sufficiently elastic that the application of an electric field or a mechanical stress will deform it. By deforming these interstitial layers, the phase relationship between grating clusters in each photorefractive layer will be changed. Holograms would be written over the entire volume of the material simultaneously in each layer, each at a particular value of the interstitial spacing. The holograms can be multiplexed and demultiplexed by changing this interstitial spacing.

As for holograms being used as memory elements, it appears that selectively, non permanently fixed information pages can comprise the equivalent of a Random Access Memory.

Second harmonic generation is of particular practical interest because efficient doubling of infrared semiconductor diode lasers will increase the storage capacity of compact disk memories by a factor of four. Additionally, optically induced superlattices can be made.

Continuous wavelength parametric amplification could be attained with a material that has a grating of continuously tunable period. A material that has been periodically poled, whether optically or not, can have the period A of its grating tuned continuously by applying an electric field, or some stress, or by changing its temperature.

What is claimed is:

1. A method for recording and reading a plurality of volume holograms in a storage medium, the storage medium being a noncentrosymmetric material, the method comprising: iteratively recording each of the plurality of volume holograms, wherein recording each particular one of the volume holograms is accomplished by simultaneously:

applying an electric potential to the storage medium, the electric potential establishing an electric field in the storage medium, said electric field having unique value for each one of the particular holograms; and illuminating the storage medium with a reference beam of coherent light, the reference beam being identical in geometry of incidence for all the volume holograms;

illuminating the storage medium with a signal beam of coherent light, the signal beam carrying all information to be stored in the particular hologram, the signal beam being coherent with the reference beam, the signal beam at least partially intersecting and interfering with the reference beam within the storage medium, establishing refractive index inhomogeneities within the medium representative of the interference between the signal and the reference beams; and reading any particular one of the volume holograms, by illuminating the storage medium with an output reference beam of coherent light, the output reference beam impinging on the storage medium at a unique angle for each one of the volume holograms to reconstruct a second signal beam containing the information of the signal beam that was used to record the particular one of the volume holograms.

2. A method for recording and reading a plurality of volume holograms in a storage medium, the storage medium being a noncentrosymmetric material, the method comprising:

iteratively recording each of the plurality of volume holograms, wherein recording each particular one of the volume holograms is accomplished by simultaneously:

illuminating the storage medium with a reference beam of coherent light, the reference beam having a unique wavelength for each one of the volume holograms; and illuminating the storage medium with a signal beam of coherent light, the signal beam carrying all information to be stored in the particular hologram, the signal beam being coherent with the reference beam, the signal beam at least partially intersecting and interfering with the reference beam within the storage medium, establishing a set of refractive index inhomogeneities within the medium representative of the interference between the signal and the reference beams; and reading any particular volume hologram by:

applying an electric potential to the storage medium, the electric potential establishing an electric field in the storage medium, the electric field having a unique value for each of the plurality of volume holograms being read; and illuminating the storage medium with an output reference beam of coherent light, the output reference beam interacting with one of said sets of refractive index inhomogeneities and reconstructing a second signal beam containing the information of the signal beam that was used to record the particular one of the volume holograms.

3. A method for recording and reading a plurality of volume holograms in a storage medium, the storage medium being a noncentrosymmetric material having an internal axis of orientation, the method comprising:

iteratively recording each of the plurality of volume holograms, wherein recording each particular one of the volume holograms is accomplished by simultaneously:

illuminating the storage medium with a reference beam of coherent light, the reference beam having a main axis of propagation; and illuminating the storage medium with a signal beam of coherent light, the signal beam having a main axis of propagation, the signal beam carrying all information to be stored in the particular hologram, the signal beam being coherent with the reference beam, the signal beam at least partially intersecting and interfering with the reference beam within the storage medium, establishing a set of refractive index inhomogeneities within the medium representative of the interference between the signal and the reference beams;

wherein the relationship between the main axis of propagation of the signal beam and the main axis of propagation of the reference beam and the internal axis of orientation of the storage medium is unique for each one of the volume holograms; and reading any particular volume hologram by:

applying an electric potential to the storage medium, the electric potential establishing an electric field in the storage medium, the electric field having a unique value for each of the plurality of volume holograms being read; and illuminating the storage medium with an output reference beam of coherent light, the output reference beam interacting with one of said sets of refractive index inhomogeneities and reconstructing a second signal beam containing the information of the signal beam that was used to record the particular one of the volume holograms.

4. A method for recording a plurality of volume holograms within a storage medium, the method comprising the steps of recording each of the volume holograms successively, wherein recording each particular one of the volume holograms is accomplished by simultaneously:

applying a force to the storage medium to induce a mechanical stress therein, the storage medium being a non centrosymmetric material, the force establishing a resulting stress and a resulting strain in the storage medium, the resulting stress and the resulting strain having a unique value for each one of the particular holograms;

illuminating the storage medium with a reference beam of coherent light, the reference beam being identical in geometry of incidence for all the volume holograms; and illuminating the storage medium with a signal beam of coherent light, the signal beam carrying all information to be stored in the particular hologram, the signal beam being coherent with the reference beam, the signal beam at least partially intersecting and interfering with the reference beam within the storage medium, establishing refractive index inhomogeneities within the medium representative of the interference between the signal and the reference beams.

5. A method for recording and reading a plurality of volume holograms, the method comprising the recording method of claim 4 and further including the step of reading any particular one of the volume holograms by illuminating the storage medium with an output reference beam of coherent light, the output reference beam being of a unique wavelength for each one of the volume holograms, to reconstruct a second signal beam containing the information of the signal beam that was used to record the particular one of the volume holograms.

6. A method for recording and reading a plurality of volume holograms, the method comprising the recording method of claim 4 and further including the step of illuminating the storage medium with an output reference beam of coherent light, the output reference beam impinging on the storage medium at a unique angle for each one of the volume holograms to reconstruct a second signal beam containing the information of the signal beam that was used to record the particular one of the volume holograms.

7. A method for recording and reading a plurality of volume holograms in a storage medium, the storage medium being a noncentrosymmetric material, the plurality of volume holograms having been stored within the storage medium as sets of refractive index inhomogeneities created within the medium, each one of said sets of inhomogeneities being representative of the interference between a reference beam and a signal beam used to record one of said holograms, the method comprising the recording method of claim 4 and further including the steps of reading any particular volume hologram by:

applying an electric potential to the storage medium, the electric potential establishing an electric field in the storage medium, the electric field having a unique value for each of the plurality of volume holograms being read; and illuminating the storage medium with an output reference beam of coherent light, the output reference beam interacting with one of said sets of refractive index inhomogeneities and reconstructing a second signal beam containing the information of the signal beam that was used to record the particular one of the volume holograms.

8. A method for recording a plurality of volume holograms within a storage medium, the method comprising the steps of recording each of the volume holograms successively, wherein recording each particular one of the volume holograms is accomplished by simultaneously:

maintaining the storage medium at a specific temperature, the storage medium being a non-centrosymmetric material, said specific temperature having a unique value for each one of the particular holograms; and illuminating the storage medium with a reference beam of coherent light, the reference beam being identical in geometry of incidence for all the volume holograms; and illuminating the storage medium with a signal beam of coherent light, the signal beam carrying all information to be stored in the particular hologram, the signal beam being coherent with the reference beam, the signal beam at least partially intersecting and interfering with the reference beam within the storage medium, establishing refractive index inhomogeneities within the medium representative of the interference between the signal and the reference beams.

9. A method for recording and reading a plurality of volume holograms, the method comprising the recording method of claim 8 and further including the step of illuminating the storage medium with an output reference beam of coherent light, the output reference beam impinging on the storage medium at a unique angle for each one of the volume holograms to reconstruct a second signal beam containing the information of the signal beam that was used to record the particular one of the volume holograms.

10. A method for recording and reading a plurality of volume holograms in a storage medium, the storage medium being a noncentrosymmetric material, the plurality of volume holograms having been stored within the storage medium as sets of refractive index inhomogeneities created within the medium, each one of said sets of inhomogeneities being representative of the interference between a reference beam and a signal beam used to record one of said holograms, the method comprising the recording method of claim 8 and further including the steps of reading any particular volume hologram by:

applying an electric potential to the storage medium, the electric potential establishing an electric field in the storage medium, the electric field having a unique value for each of the plurality of volume holograms being read; and illuminating the storage medium with an output reference beam of coherent light, the output reference beam interacting with one of said sets of refractive index inhomogeneities and reconstructing a second signal beam containing the information of the signal beam that was used to record the particular one of the volume holograms.

11. A method for recording and reading a plurality of volume holograms, the method comprising the recording method of claim 8 and further including the step of reading any particular one of the volume holograms by illuminating the storage medium with an output reference beam of coherent light, the output reference beam being of a unique wavelength for each one of the volume holograms, to reconstruct a second signal beam containing the information of the signal beam that was used to record the particular one of the volume holograms.

12. A method for reading any particular one of a plurality of volume holograms stored within a storage medium, the method comprising the steps of simultaneously:

maintaining the storage medium at a specific temperature, the storage medium being a non-centrosymmetric material, the plurality of volume holograms having been stored within the storage medium as sets of refractive index inhomogeneities created within the medium, each one of said sets of inhomogeneities being representative of the interference between a reference beam and a signal beam used to record one of said holograms, the specific temperature having a unique value for each of the plurality of volume holograms being read; and illuminating the storage medium with an output reference beam of coherent light, the output reference beam interacting with one of said sets of refractive index inhomogeneities and reconstructing a second signal beam containing the information of the signal beam that was used to record the particular one of the volume holograms.

13. A method for reading any particular one of a plurality of volume holograms stored within a storage medium, the method comprising the steps of simultaneously:

applying a force to the storage medium to induce a mechanical stress therein, the storage medium being a non centrosymmetric material, the plurality of volume holograms having been stored within the storage medium as sets of refractive index inhomogeneities created within the medium, each one of said sets of inhomogeneities being representative of the interference between a reference beam and a signal beam used to record one of said holograms, the force establishing a resulting stress and a resulting strain in the storage medium, the resulting stress and the resulting strain having a unique value for each of the plurality of volume holograms being read; and illuminating the storage medium with an output reference beam of coherent light, the output reference beam interacting with one of said sets of refractive index inhomogeneities and reconstructing a second signal beam containing the information of the signal beam that was used to record the particular one of the volume holograms.

14. A method for recording a volume hologram within a storage medium, the hologram having a decay time representative of the amount of time for the hologram to decay while reading out the hologram with a light beam of the same wavelength, intensity, polarization, and angle as was used in recording the hologram, the method comprising the steps of simultaneously:

illuminating the storage medium with a first beam of coherent light, the storage medium being a ferroelectric material; and illuminating the storage medium with a second beam of coherent light, the second beam being coherent with the first beam, the second beam at least partially intersecting and interfering with the first beam within the storage medium, establishing refractive index inhomogeneities within the medium representative of the interference between the first and the second beams;

for a period of writing time until the resulting decay time of the resulting hologram is substantially longer than the writing time.

15. A method for recording a volume hologram within a storage medium, the hologram having a decay time representative of the amount of time for the hologram to decay while reading out the hologram with a light beam of the same wavelength, intensity, polarization, and angle as was used in recording the hologram, the method comprising the steps of simultaneously:

illuminating the storage medium with a first beam of coherent light, the storage medium being a ferroelectric material; and illuminating the storage medium with a second beam of coherent light, the second beam being coherent with the first beam, the second beam at least partially intersecting and interfering with the first beam within the storage medium, establishing refractive index inhomogeneities within the medium representative of the interference between the first and the second beams; wherein the first and second beams have an intensity during the time period of the illuminating steps selected to achieve a resulting hologram having a resulting decay time substantially longer than the time period of the illuminating steps.

16. A method for recording a volume hologram within a storage medium, the hologram having a decay time representative of the amount of time for the hologram to decay while reading out the hologram with a light beam of the same wavelength, intensity, polarization, and angle as was used in recording the hologram, the method comprising the steps of simultaneously:

illuminating the storage medium with a first beam of coherent light, the storage medium being a ferroelectric material; and illuminating the storage medium with a second beam of coherent light, the second beam being coherent with the first beam, the second beam at least partially intersecting and interfering with the first beam within the storage medium, establishing refractive index inhomogeneities within the medium representative of the interference between the first and the second beams: wherein the product of the sum of the intensities of the first and second beams and of the time period of the illuminating steps is selected to yield a resulting hologram having a decay time longer than the time period of the illuminating steps.

17. A method for recording a volume hologram within a storage medium, the method comprising the steps of simultaneously:

illuminating the storage medium with a first beam of coherent light, the storage medium being a ferroelectric material; and illuminating the storage medium with a second beam of coherent light, the second beam being coherent with the first beam, the second beam at least partially intersecting and interfering with the first beam within the storage medium, thereby inducing refractive index inhomogeneities within the medium representative of the interference between the first and the second beams.

18. A method for recording and reading a volume hologram, the method comprising the recording method of claims 14, 15, 16 or 17, and further including the step of reading the volume hologram by illuminating the storage medium with an output reference beam of coherent light to reconstruct a signal beam containing the information of the first beam.

19. A method for erasing a portion of a first volume hologram, in a storage medium, the method comprising the steps of:

recording a second volume hologram, the second hologram being capable of being read without significant interference from the first hologram and containing the information to be erased from the first hologram, by illuminating the storage medium simultaneously with:

a first beam of coherent light, the storage medium being a ferroelectric material; and a second beam of coherent light, the second beam being coherent with the first beam, the second beam carrying all information to be stored in the second hologram, the second beam at least partially intersecting and interfering with the first beam within the storage medium, establishing a local ferroelectric domain pattern within the medium representative of the interference between the first and the second beams; and subsequently applying an electric potential to the storage medium, the electric potential establishing an electric field within the storage medium, the electric field depolarizing the local ferroelectric domain pattern representative of the portions that the first and second holograms have in common, wherein the first volume hologram has been recorded by having illuminated the storage medium simultaneously with: a third beam of coherent light; and a fourth beam of coherent light, the fourth beam being coherent with the third beam, the fourth beam carrying all information to be stored in the first hologram, the fourth beam at least partially intersecting and interfering with the third beam within the storage medium, establishing a local ferroelectric domain pattern within the medium representative of the interference between the third and the fourth beams.

20. A method for recording and reading a plurality of volume holograms in a storage medium, the storage medium being a noncentrosymmetric material, the method comprising the steps of: iteratively recording each of the plurality of volume holograms, wherein recording each particular one of the volume holograms is accomplished by simultaneously:
- applying an electric potential to the storage medium, the electric potential establishing an electric field in the storage medium, said electric field having a unique value for each one of the particular holograms; and
- illuminating the storage medium with a reference beam of coherent light, the reference beam being identical in geometry of incidence for all the volume holograms; and
- illuminating the storage medium with a signal beam of coherent light, the signal beam carrying all information to be stored in the particular hologram, the signal beam being coherent with the reference beam, the signal beam at least partially intersecting and interfering with the reference beam within the storage medium, establishing refractive index inhomogeneities within the medium representative of the interference between the signal and the reference beams; and
- reading any particular one of the volume holograms, by
  - illuminating the storage medium with an output reference beam of coherent light, the output reference beam being of a unique wavelength for each one of the volume holograms, to reconstruct a second signal beam containing the information of the signal beam that was used to record the particular one of the volume holograms.

21. A method according to claims 1, 2, 3, 4, 5, 6, 7, 8, 9, 10, 11, 12, 13, 20 or wherein the storage medium is a ferroelectric material.

* * * * *